United States Patent
Lee et al.

(10) Patent No.: US 12,258,266 B2
(45) Date of Patent: Mar. 25, 2025

(54) METHOD AND SYSTEM FOR FABRICATING A MEMS DEVICE

(71) Applicant: InvenSense, Inc., San Jose, CA (US)

(72) Inventors: Daesung Lee, San Jose, CA (US); Alan Cuthbertson, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 176 days.

(21) Appl. No.: 17/877,089

(22) Filed: Jul. 29, 2022

(65) Prior Publication Data

US 2023/0037849 A1 Feb. 9, 2023

Related U.S. Application Data

(60) Provisional application No. 63/229,390, filed on Aug. 4, 2021.

(51) Int. Cl.
*B81C 1/00* (2006.01)
*B81B 3/00* (2006.01)
(Continued)

(52) U.S. Cl.
CPC ........ *B81C 1/00396* (2013.01); *B81B 3/0005* (2013.01); *B81B 3/0081* (2013.01); *B81B 7/0038* (2013.01); *B81B 7/007* (2013.01); *B81B 7/02* (2013.01); *B81C 1/00269* (2013.01); *B81C 1/00992* (2013.01); *B81B 2201/0235* (2013.01); *B81B 2201/0242* (2013.01); *B81B 2203/0315* (2013.01); *B81B 2203/04* (2013.01); *B81B 2207/07* (2013.01); *B81C 2201/0119* (2013.01); *B81C 2201/013* (2013.01); *B81C 2201/0132* (2013.01); *B81C 2201/014* (2013.01); *B81C 2201/0147* (2013.01);
(Continued)

(58) Field of Classification Search
None
See application file for complete search history.

(56) References Cited

U.S. PATENT DOCUMENTS

2012/0125747 A1* 5/2012 Chu ................... H01H 59/0009
29/622
2014/0225206 A1 8/2014 Lin et al.
(Continued)

FOREIGN PATENT DOCUMENTS

TW 201726539 A 8/2017

OTHER PUBLICATIONS

M. Tilli et al., "Outgassing and Gettering", Chapter 39 in Handbook of Silicon Based MEMS Materials and Technologies, 2nd ed. Elsevier, Amsterdam. (Year: 2015).*

(Continued)

*Primary Examiner* — Jiong-Ping Lu

(57) ABSTRACT

A method includes forming a bumpstop from a first intermetal dielectric (IMD) layer and forming a via within the first IMD, wherein the first IMD is disposed over a first polysilicon layer, and wherein the first polysilicon layer is disposed over another IMD layer that is disposed over a substrate. The method further includes depositing a second polysilicon layer over the bumpstop and further over the via to connect to the first polysilicon layer. A standoff is formed over a first portion of the second polysilicon layer, and wherein a second portion of the second polysilicon layer is exposed. The method includes depositing a bond layer over the standoff.

23 Claims, 34 Drawing Sheets

(51) Int. Cl.
  *B81B 7/00* (2006.01)
  *B81B 7/02* (2006.01)
(52) U.S. Cl.
  CPC ............... *B81C 2201/0159* (2013.01); *B81C 2201/016* (2013.01); *B81C 2201/019* (2013.01); *B81C 2201/0198* (2013.01); *B81C 2201/112* (2013.01); *B81C 2203/0109* (2013.01); *B81C 2203/0118* (2013.01); *B81C 2203/019* (2013.01); *B81C 2203/035* (2013.01); *B81C 2203/036* (2013.01)

(56) References Cited

U.S. PATENT DOCUMENTS

| | | |
|---|---|---|
| 2014/0264661 A1 | 9/2014 | Cheng et al. |
| 2014/0264662 A1* | 9/2014 | Cheng ................ B81B 7/02 257/419 |
| 2017/0305738 A1 | 10/2017 | Chang et al. |
| 2018/0002166 A1 | 1/2018 | Chang et al. |
| 2020/0262697 A1 | 8/2020 | Lee et al. |
| 2023/0045563 A1 | 2/2023 | Lee et al. |

OTHER PUBLICATIONS

PCT/US2022/038835 Filed Jul. 29, 2022—PCT International Search Report and Written Opinion, dated Nov. 9, 2022, 12 pages.
PCT/US2022/038850 Filed Jul. 29, 2022—PCT International Search Report and Written Opinion, dated Nov. 9, 2022, 12 pages.
PCT/US2022/038861 Filed Jul. 29, 2022—PCT International Search Report and Written Opinion, dated Nov. 15, 2022, 16 pages.

* cited by examiner

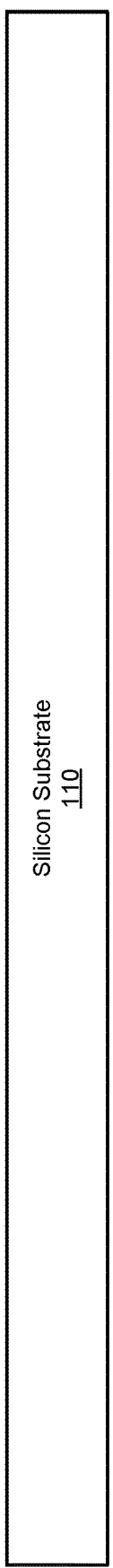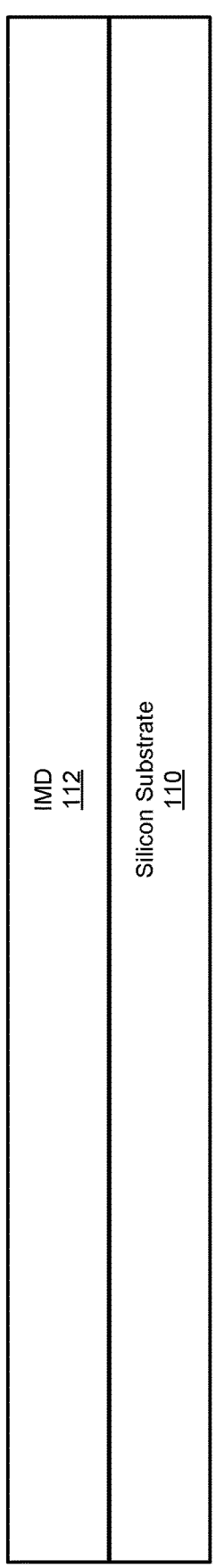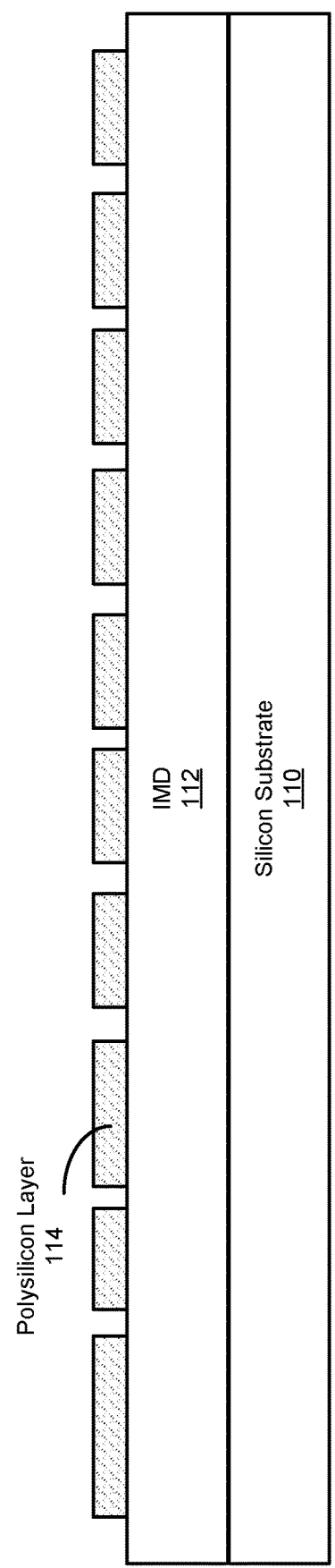

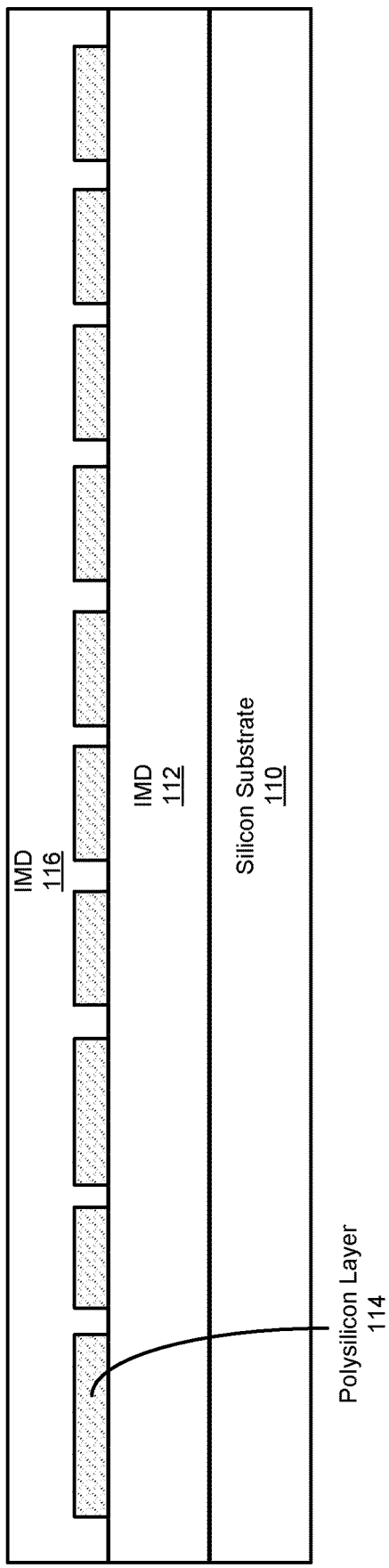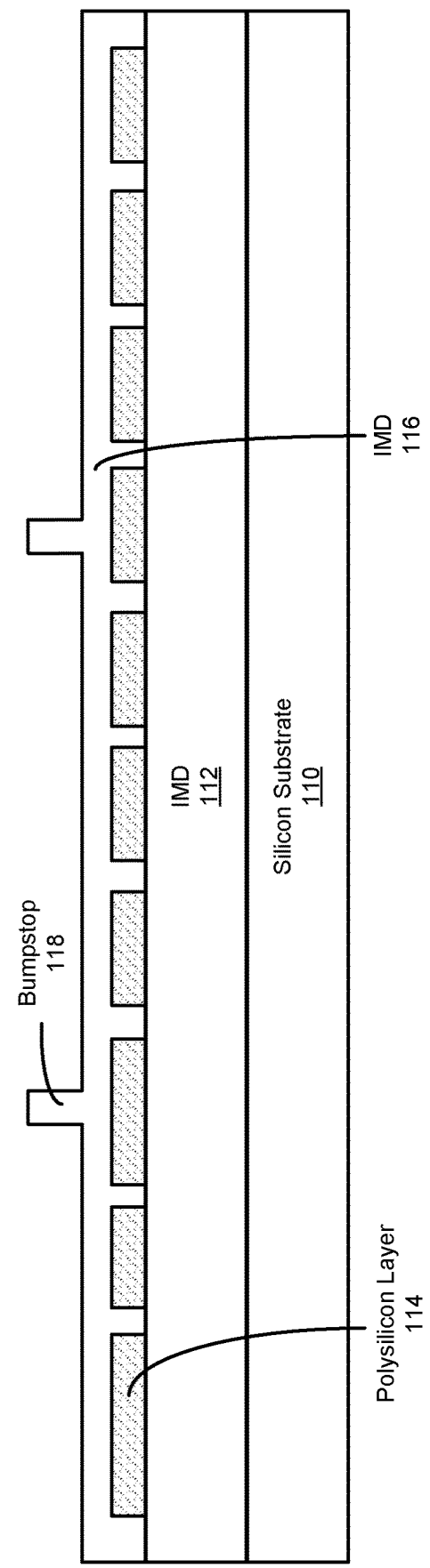

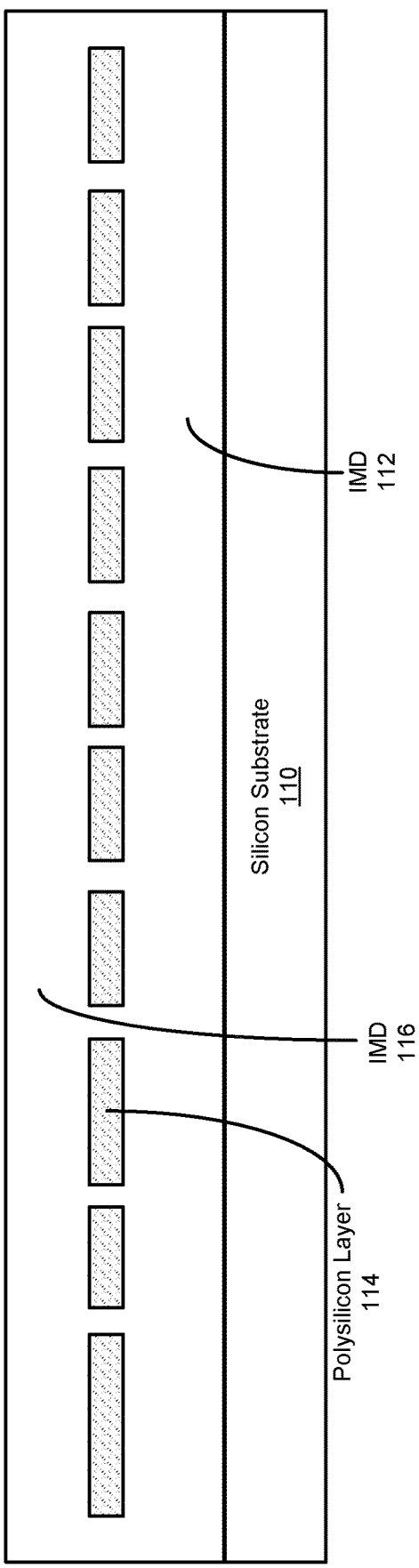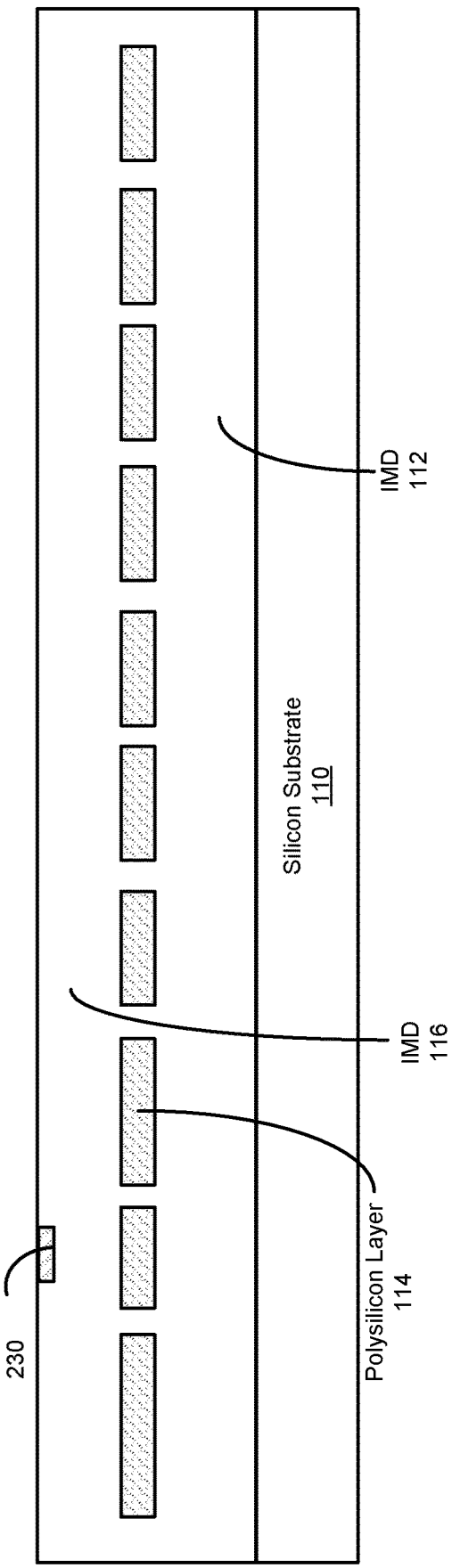

Forming a bumpstop from a first intermetal dielectric (IMD) layer and forming a via within the first IMD, wherein the first IMD is disposed over a first polysilicon layer, and wherein the first polysilicon layer is disposed over another IMD layer that is disposed over a substrate
3702

Depositing a second polysilicon layer over the bumpstop and further over the via to connect to the first polysilicon layer
3704

Forming a standoff over a first portion of the second polysilicon layer, and wherein a second portion of the second polysilicon layer is exposed
3706 depositing a bond layer over the standoff
3708

Figure 37

METHOD AND SYSTEM FOR FABRICATING A MEMS DEVICE

RELATED APPLICATIONS

The instant application is a non-provisional application and claims the benefit and priority to a provisional application No. 63/229,390 that was filed on Aug. 4, 2021, which is incorporated herein in its entirety.

BACKGROUND

MEMS ("micro-electro-mechanical systems") are a class of devices that are fabricated using semiconductor-like processes and exhibit mechanical characteristics. For example, MEMS devices may include the ability to move or deform. In many cases, but not always, MEMS interact with electrical signals. A MEMS device may refer to a semiconductor device that is implemented as a micro-electro-mechanical system. A MEMS device includes mechanical elements and may optionally include electronics (e.g., electronics for sensing). MEMS devices include but are not limited to, for example, gyroscopes, accelerometers, magnetometers, pressure sensors, etc.

Some MEMS devices may be formed by bonding a MEMS layer to a Complementary Metal-Oxide-Semiconductor (CMOS) layer, where the MEMS layer may include a cap layer and a MEMS device layer and wherein the CMOS layer may include sensing electrodes and other circuitries. In general, sensors utilize monolithic integration of a MEMS layer and a CMOS layer. Unfortunately, monolithic integration of the MEMS layer restricts its flexibility with respect to using advanced CMOS process technology for high end sensor applications.

Traditionally, standoffs are created on the MEMS device layer through an etching process. The standoffs are then used to bond two components to one another and form one or more cavities. Unfortunately, creating the standoff by etching through the MEMS device layer using lithography causes issues such as photoresist pooling issue in the MEMS device layer patterning with the standoff.

A number of issues, e.g., high temperatures involving the fabrication process, stability of cavity pressure, stiction, etc., may impact the performance of the sensor. For example, high temperatures may be involved during the fabrication process of the MEMS layer. Unfortunately, high temperatures may cause protrusion on the electrodes, known as hillock effect, causing performance degradation. Certain sensing applications may need cavity pressure to be preserved. Unfortunately, over time cavity pressure may become unstable due to outgassing or slow gettering inside the cavity of the device (without the presence of the active getter that results in higher drift in the cavity pressure in operation). MEMS layer may utilize a structure such as a bumpstop to prevent the movable components of the MEMS device layer, e.g., proof mass, to contact and damage circuitries underneath it. Unfortunately, the movable components may stick to the bumpstop and fail to release (also known as stiction) causing performance issues with the device.

SUMMARY

Accordingly, a need has arisen to create a MEMS layer in a non-monolithic fashion, thereby enabling the MEMS layer to be integrated with a more advanced semiconductor substrates. Moreover, a need has arisen to reduce hillock effect on various components, e.g., electrodes, improve stiction, stabilize the cavity pressure, and improve MEMS device layer lithography.

In some embodiments, the standoffs are formed on a substrate that is fabricated separate and apart from the MEMS device layer in order to improve the MEMS device layer lithography. In some embodiments, various components, e.g., electrodes, may be formed out of a polysilicon material with higher thermal capacity in order to reduce hillock effect, thereby improving performance. Moreover, polysilicon interconnect may be used to connect the electrodes with high thermal capacity. It is appreciated that a getter material may be used to stabilize the cavity pressure, in some nonlimiting examples. Stiction may be improved, in some embodiments, by using a layer of polysilicon on the bumpstop.

A method includes depositing a first intermetal dielectric (IMD) layer over a substrate; depositing a first polysilicon layer over the first IMD layer; depositing a second IMD layer over the first polysilicon layer; etching a first portion of the second IMD layer to form a bumpstop region; etching a second portion of the second IMD layer to expose a first portion of the first polysilicon layer; subsequent to forming the bumpstop region and subsequent to exposing the first portion of the first polysilicon layer, depositing a second polysilicon layer over the second IMD layer and further over the first portion of the first polysilicon layer, wherein the second polysilicon layer directly connects to the first portion of the first polysilicon layer; etching a portion of the second polysilicon layer to form a patterned second polysilicon layer and to expose a portion of the second IMD layer, wherein the etching the portion of the second polysilicon layer forms the bumpstop and a plurality of electrodes; depositing a third IMD layer over the patterned second polysilicon layer and the exposed portion of the second IMD layer; forming a via through the third IMD layer to expose a first portion of the patterned second polysilicon layer; filling the via; forming a bond layer over the via; and etching a portion of the third IMD layer to expose a second portion of the patterned second polysilicon layer, wherein the second portion of the patterned second polysilicon layer is different from the first portion of the patterned second polysilicon layer.

In some embodiments the method further includes bonding a micro-electro-mechanical systems (MEMS) layer comprising a cap layer and a MEMS device layer structures to the substrate. It is appreciated that in some embodiments the bonding comprises eutectically bonding the bond layer over the via with Germanium on the MEMS device layer.

It is appreciated that the etching a portion of the third IMD layer may comprises of exposing the bumpstop and the plurality of electrodes. It is appreciated that the method may further include forming a getter layer, e.g., Ti, over an electrode. It is appreciated that the etching a portion of the third IMD layer may include exposing the getter layer.

It is appreciated that the method may further include depositing a passivation layer comprising SiN over the third IMD layer. In some embodiments, the method may further include depositing a high-density plasma (HDP) oxide in the passivation and within the third IMD layer.

A method includes forming a bumpstop from a first intermetal dielectric (IMD) layer and forming a via within the first IMD, wherein the first IMD is disposed over a first polysilicon layer, and wherein the first polysilicon layer is disposed over another IMD layer that is disposed over a substrate; depositing a second polysilicon layer over the bumpstop and further over the via to connect to the first polysilicon layer; forming a standoff over a first portion of the second polysilicon layer, and wherein a second portion of the second polysilicon layer is exposed; and depositing a bond layer over the standoff.

In some embodiments, the method further includes bonding a micro-electro-mechanical systems (MEMS) layer comprising a MEMS device layer and a cap layer to the substrate via the bond layer over the standoff, wherein the second portion of the second polysilicon layer is within a cavity formed after bonding.

According to some embodiments, the forming the standoff may include depositing a second IMD layer over the second polysilicon layer; forming a via through the second IMD layer to expose a portion of the second polysilicon layer underneath the second IMD layer; filling the via; depositing another bond layer covering the via and the second IMD layer; patterning the another bond layer, wherein a region associated with the standoff is covered by the another bond layer; and etching the second IMD layer that is uncovered by the another bond layer.

According to some embodiments, the method further includes forming a passivation layer over the second IMD layer, and wherein the bond layer covers the passivation layer, and wherein the passivation layer that is uncovered by the bond layer after patterning is etched. It is appreciated that in some embodiments, the method further includes depositing an outgassing substance within the second IMD layer. According to some embodiments, the method further includes forming a getter layer, e.g., Ti, over the second polysilicon layer.

A device includes a substrate; an intermetal dielectric (IMD) layer formed over the substrate, wherein the IMD layer comprises a cavity; a first polysilicon layer at a first depth within the IMD layer; a second polysilicon layer disposed over the IMD layer and positioned at a bottom of the cavity, wherein at least one portion of the first polysilicon layer is connected to at least a portion of the second polysilicon layer; a third polysilicon layer at a second depth within the IMD layer, wherein the third polysilicon layer is positioned outside of the cavity; a filled via formed within the IMD layer and over at least a portion of the third polysilicon layer; and a bond material disposed over the filled via.

It is appreciated that in some embodiments, the third polysilicon layer is coplanar with at least a portion of the second polysilicon layer that is disposed at the bottom of the cavity.

The device may further include a bumpstop formed from the IMD layer and positioned at the bottom of the cavity. It is appreciated that the bumpstop is covered with the second polysilicon layer.

The device may further include a micro-electro-mechanical systems (MEMS) layer comprising micro-electro-mechanical systems (MEMS) device layer and a cap layer, wherein the MEMS layer is bonded to the bond material disposed over the filled via.

According to some embodiments, the deice may further include an outgassing substance positioned outside of the cavity. In yet another embodiment, the device further includes a getter material disposed over one portion of the second polysilicon layer.

In some embodiments, a method includes depositing a first intermetal dielectric (IMD) layer over a substrate; depositing a first polysilicon layer over the first IMD layer; depositing a second IMD layer over the first polysilicon layer; etching the second IMD layer to form a standoff and a bumpstop; etching at least a portion of the second IMD layer other than the standoff and the bumpstop to form a via to expose a portion of the first polysilicon layer; depositing a second polysilicon layer over the standoff, the bumpstop, the exposed portion of the first polysilicon layer that connects the two polysilicon layers together, and the second IMD layer; depositing a bond layer over the second polysilicon layer; patterning the bond layer to cover the standoff; and patterning a portion of the second polysilicon layer to expose a portion of the second IMD layer and to form a plurality of electrodes.

The method may further include bonding a micro-electro-mechanical systems (MEMS) layer comprising a MEMS device layer and a cap layer to the standoff. In some embodiments, the method further includes forming a getter layer over the second polysilicon layer prior to depositing the bond layer. According to some embodiments, the method further includes patterning the getter layer, e.g., Ti, to expose a portion of the second polysilicon layer. In some embodiments, the method further includes depositing a passivation layer, e.g., SiN, over the second IMD layer prior to forming the standoff and the bumpstop. In some embodiments, the method further includes depositing an outgassing substance within the second IMD layer prior to etching the least the portion of the second IMD layer.

A device includes a substrate; an intermetal dielectric (IMD) layer formed over the substrate, wherein the IMD layer comprises a bumptop, an electrode and a standoff; a first polysilicon layer at a first depth within the IMD layer; a second polysilicon layer disposed over the IMD layer, wherein the second polysilicon layer is disposed over the bumpstop and the electrode, and wherein at least one portion of the first polysilicon layer is connected to at least a portion of the second polysilicon layer; and a bond material disposed over the standoff.

The device may further include vias connecting the bond material to the second polysilicon layer. The device may further include a micro-electro-mechanical systems (MEMS) layer comprising a MEMS device layer and a cap layer, wherein germanium layer over the MEMS device layer is eutecticly bonded to the bond material disposed over the standoff. In some embodiments, the device further includes an outgassing substance disposed within the IMD layer and within an enclosed cavity region between the cap layer and the substrate. According to some embodiments, the device further includes a getter material disposed over one portion of the second polysilicon layer.

These and other features and advantages will be apparent from a reading of the following detailed description.

BRIEF DESCRIPTION OF DRAWINGS

FIGS. 1-19 show fabrication process for a substrate with a standoff, bumpstop with improved stiction, and polysilicon electrodes according to one aspect of the present embodiments.

FIGS. 22-34B show fabrication process for a substrate with a standoff, bumpstop with improved stiction, and polysilicon electrodes according to another aspect of the present embodiments.

FIG. 37 shows yet another flow diagram for fabricating a substrate with a standoff, bumpstop with improved stiction, and polysilicon electrodes according to one aspect of the present embodiments.

DESCRIPTION

Figure 6:
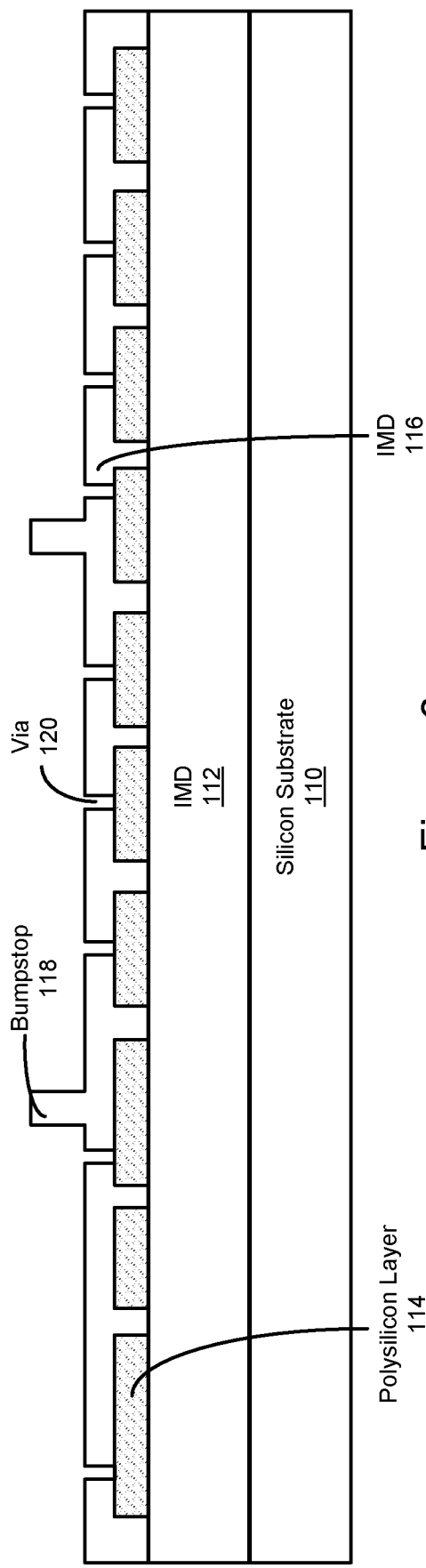

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc., are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

A MEMS layer may include a MEMS device layer coupled to a cap layer. The MEMS device layer may commonly be referred to as the actuator layer with movable structures, e.g., proof mass, etc. The cap layer coupled to the MEMS device layer may form one or more cavities for housing moveable structures of gyro, accelerometer, etc. It is appreciated that the MEMS layer may be coupled to a semiconductor layer, e.g., a CMOS layer, to form a MEMS device.

The embodiments described herein, decouples the fabrication process for the MEMS layer in a non-monolithic fashion. The embodiments fabricate polysilicon electrodes and/or polysilicon interconnection layer on a substrate, thereby reducing hillock effects and eliminating a need to create slotting to account for hillock. Moreover, the embodiments utilize polysilicon bumpstop to reduce stiction. In yet some embodiments, an outgassing substance is formed by depositing an outgassing substance and/or a getter material is deposited in order to stabilize cavity pressure, even over time. Moreover, standoff formation in the MEMS device layer is eliminated by forming it on a substrate, thereby improving the MEMS device layer lithography by reducing photoresist pooling. It is appreciated that for the MEMS device layer patterning, photoresist may be thicker in the transition region with topography (thicker near the standoff region), thereby causing uniformity issues between different regions such as patterning far from the standoff as opposed to near the standoff region. In some embodiments getter material comprises Titanium, Cobalt or Zirconium and outgassing substance comprises high-density plasma oxide.

Referring now to FIGS. 1-19, fabrication process for a substrate with a standoff, bumpstop with improved stiction, and polysilicon electrodes according to one aspect of the present embodiments is shown. Referring specifically to FIG. 1, a silicon substrate 110 is provided. The silicon substrate 110 may be a p-silicon substrate. The fabrication process is described with respect to a p-silicon substrate for illustrative purposes and should not be construed as limiting the scope of the embodiments. For example, an n-silicon substrate may be used.

Referring now to FIG. 2, an intermetal dielectric (IMD) 112 layer is deposited over the silicon substrate 110. The IMD layer may include material such as $SiO_2$, SiN, etc. It is appreciated that in some embodiments, the IMD 112 layer may be patterned. For example, a via may be formed in the IMD 112 layer to expose the silicon substrate 110.

Referring now to FIG. 3, a polysilicon layer 114 is deposited over the IMD 112 layer. In one nonlimiting example, the polysilicon layer 114 may cover the entire surface of the IMD 112 layer and may be subsequently patterned using a mask, e.g., a hardmask, a photoresist mask, etc. In one nonlimiting example, the polysilicon layer 114 may be doped in-situ or ion implantation may occur after undoped poly is deposited.

Referring now to FIG. 4, an IMD 116 layer is deposited over the patterned polysilicon layer 114 and further on the IMD 112 layer. It is appreciated that the IMD 116 layer may be the same material as the IMD 112 layer. However, in this figure they are shown demarked for illustration purposes only. In one nonlimiting example, the IMD 116 layer is chemically and mechanically planarized (CMP). In one alternative embodiment, the IMD 116 layer deposition may be a multistep process. For example, one layer of IMD may be deposited, chemically and mechanically planarized, followed by depositing a passivation layer such as SiN layer, and subsequently depositing another layer of IMD layer.

Referring now to FIG. 5, bumpstops 118 are formed from the IMD 116 layer by etching through the IMD 116. For example, a mask may be used to cover the region(s) corresponding to the bumpstops. During the etching process the exposed regions of the IMD 116 layer are etched away, forming bumpstops 118 where the IMD layer 116 was covered by the mask. It is appreciated that forming two bumptops are shown for illustrative purposes and should not be construed as limiting the scope of the embodiments. For example, one bumpstop or more than two bumpstops may be formed. In one nonlimiting example where the IMD 116 layer includes two layers of IMD sandwiching a passivation layer, the bumpstop(s) may be formed by etching the second IMD layer and the passivation layer.

Referring now to FIG. 6, a mask may be formed and patterned over IMD 116 layer and the bumpstop 118 to form one or more vias 120. It is appreciated that portions of the IMD 116 layer that are not covered by the patterned mask, e.g., exposed portions of the IMD 116 layer may be etched away to form vias 120 in order to reach the underlying polysilicon layer 114 and to expose a portion of the polysilicon layer 114 underneath.

Figure 7:
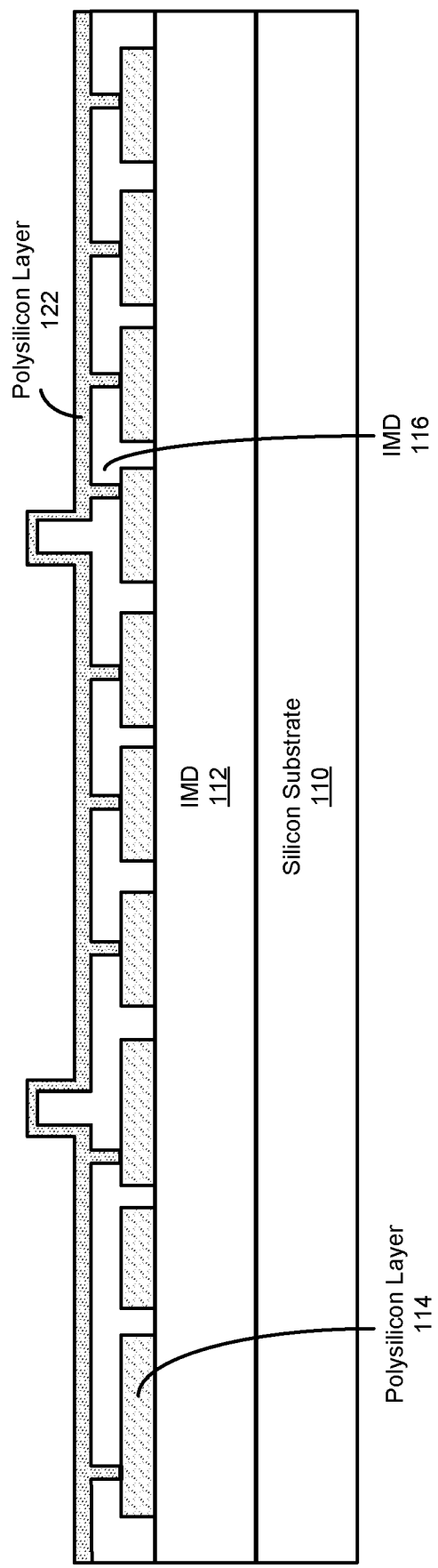

Referring now to FIG. 7, a polysilicon layer 122 is deposited over the IMD layer 116, over the bumpstops 118, and further over the exposed portions of the polysilicon layer 114 that are exposed by forming vias 120. In other words, the polysilicon layer 122 fills in the formed vias 120. It is appreciated that the polysilicon layer 122 may be the same or different from the polysilicon layer 114. It is appreciated that the polysilicon layers 122 and 114 are shown with different hatching for demarcation purposes only and should not be construed as limiting the scope of the embodiments.

Figure 8:
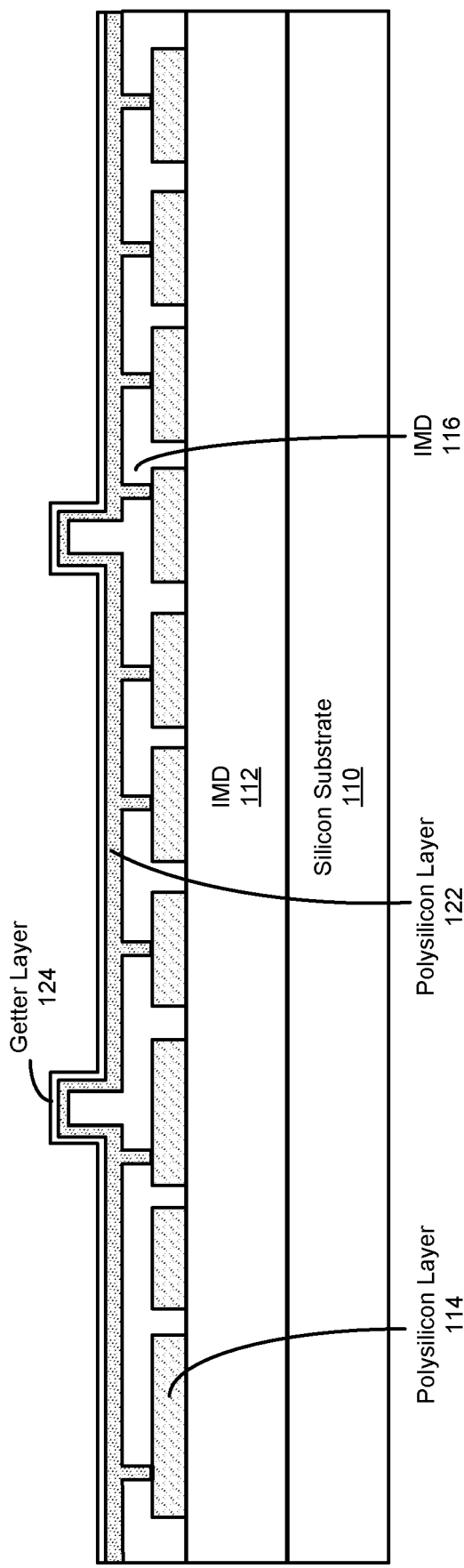
Figure 9:
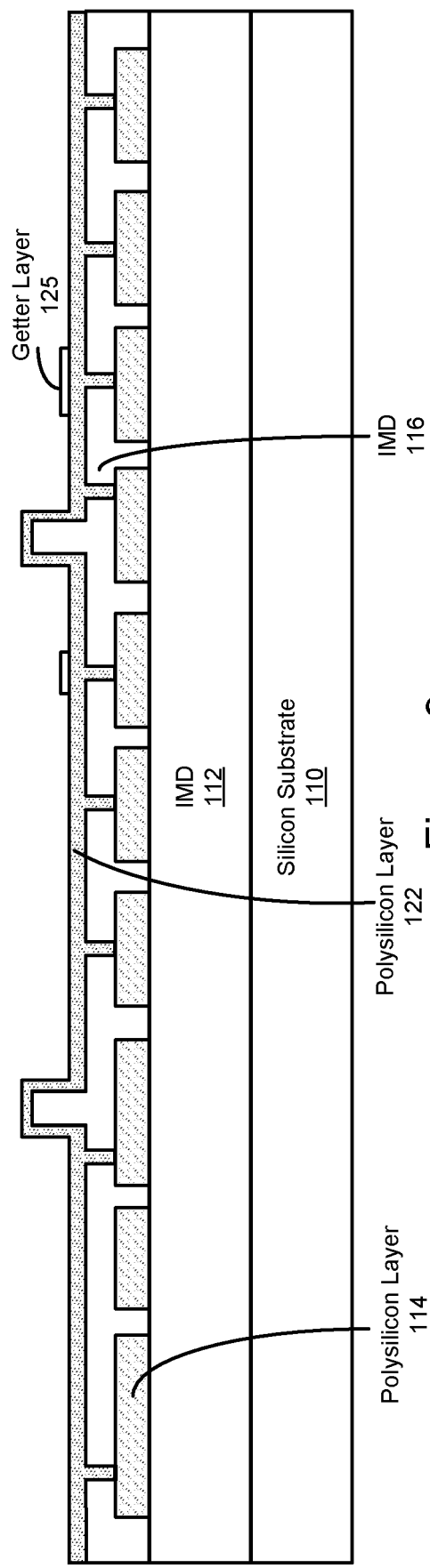

Referring now to FIG. 8, a getter layer 124 is deposited over the polysilicon layer 122. In some embodiments the getter layer 124 may compose of Ti, TiN, or other similar material. Referring now to FIG. 9, the getter layer 124 is patterned to form a patterned getter layer 125. It is appreciated that the getter layer 124 may be patterned using a mask. It is appreciated that the patterned getter layer 125 is formed over an electrode in a region corresponding to a cavity within a sensor that may need a more stable cavity pressure, e.g., used in gyro. It is appreciated that two regions covered with getter layer 125 is shown for illustrative purposes only and should not be construed as limiting the scope of the embodiments. For example, three regions may be quoted with the getter layer 125 or one region may be quoted with the getter layer 125.

Figure 10:
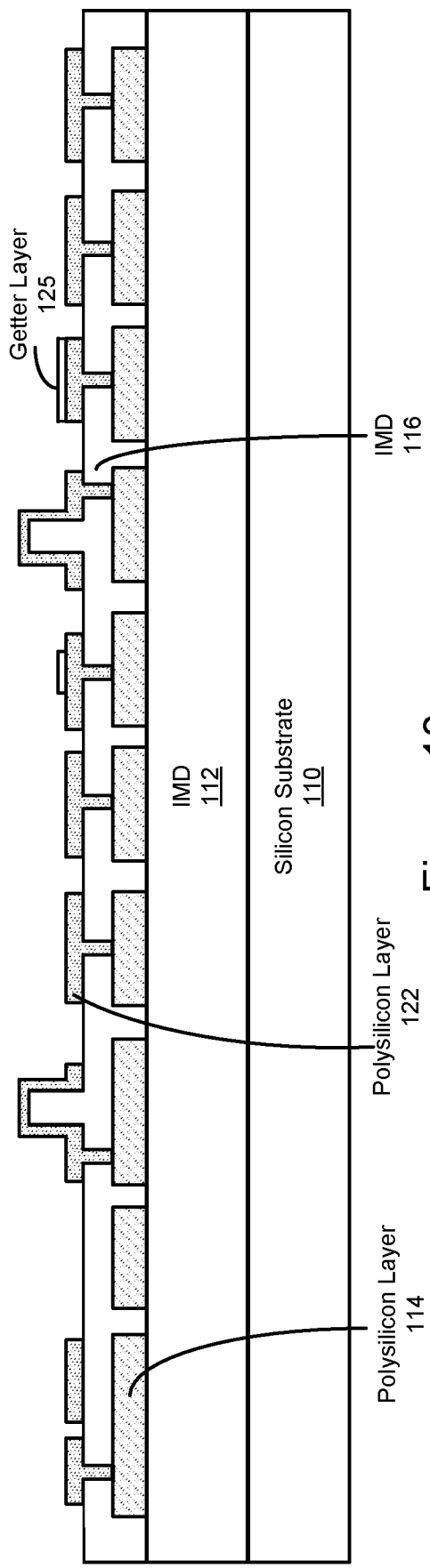

Referring now to FIG. 10, the patterning of the polysilicon layer 122 is shown. It is appreciated that a mask may be patterned and used to pattern the polysilicon layer 122. For example, the mask may be used and patterned such that the uncovered portions of the polysilicon layer 122 by the patterned mask can be etched away to form the patterned polysilicon layer 122 as shown in FIG. 10.

Figure 11:
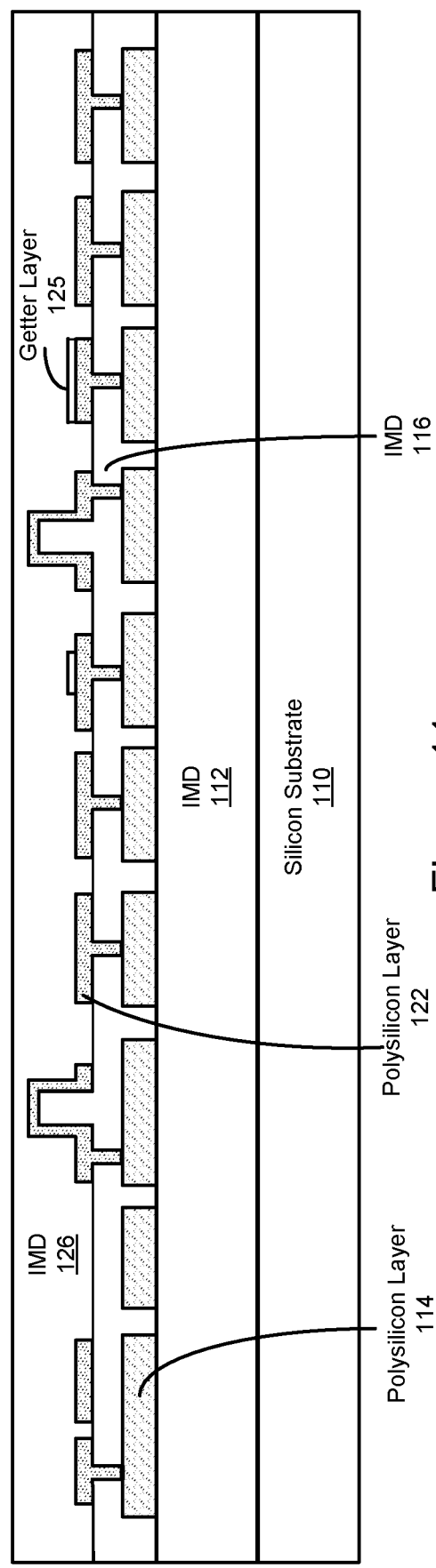
Figure 12:
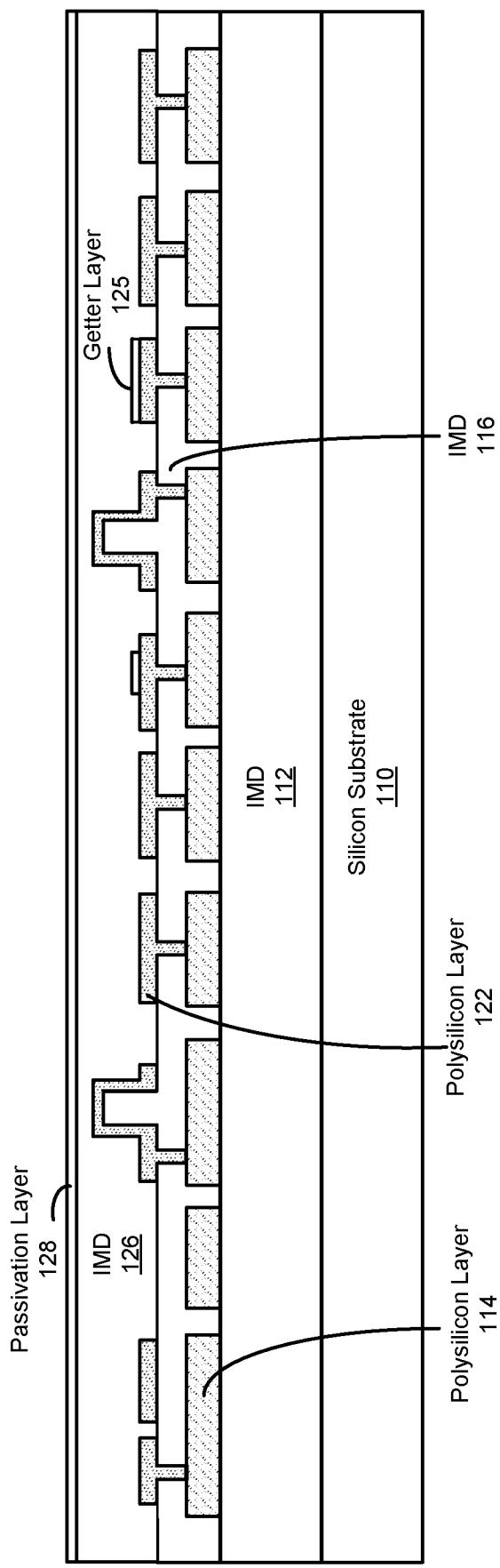

Referring now to FIG. 11, a layer of IMD 126 is deposited over the patterned polysilicon layer 122, over the patterned getter layer 125, and further over the exposed portions of the IMD 116 layer. Once the IMD 126 layer is deposited it may go through a CMP process. Referring now to FIG. 12, a passivation layer 128 may be formed over the IMD 126 layer. The passivation layer 128 may include material such as SiN.

Figure 13:
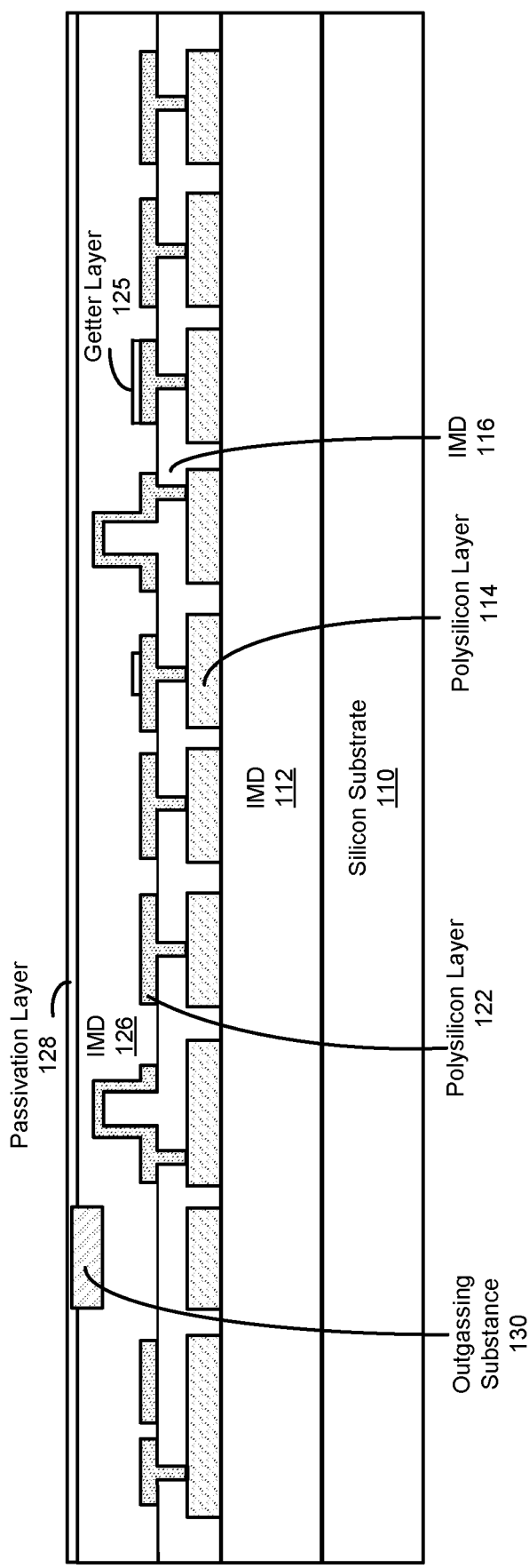

Referring now to FIG. 13, a portion of the passivation layer 128 and/or the IMD 126 layer may be etched to expose a portion of the IMD layer 126. A high-density plasma (HDP) oxide may be deposited in the passivation and within the IMD 126 layer to form an outgassing substance 130. Chemical mechanical polishing with passivation layer etch stop or patterning process can remove HDP oxide on the passivation layer. It is appreciated that forming the outgassing substance 130 may be optional and that the outgassing substance 130 may be absent in some embodiments. It is appreciated that once the outgassing substance 130 is formed, another layer of passivation layer 128 may formed over the outgassing substance 130 in order to protect the outgassing substance 130 from outgassing during further fabrication processing until the final anneal step.

Figure 14:
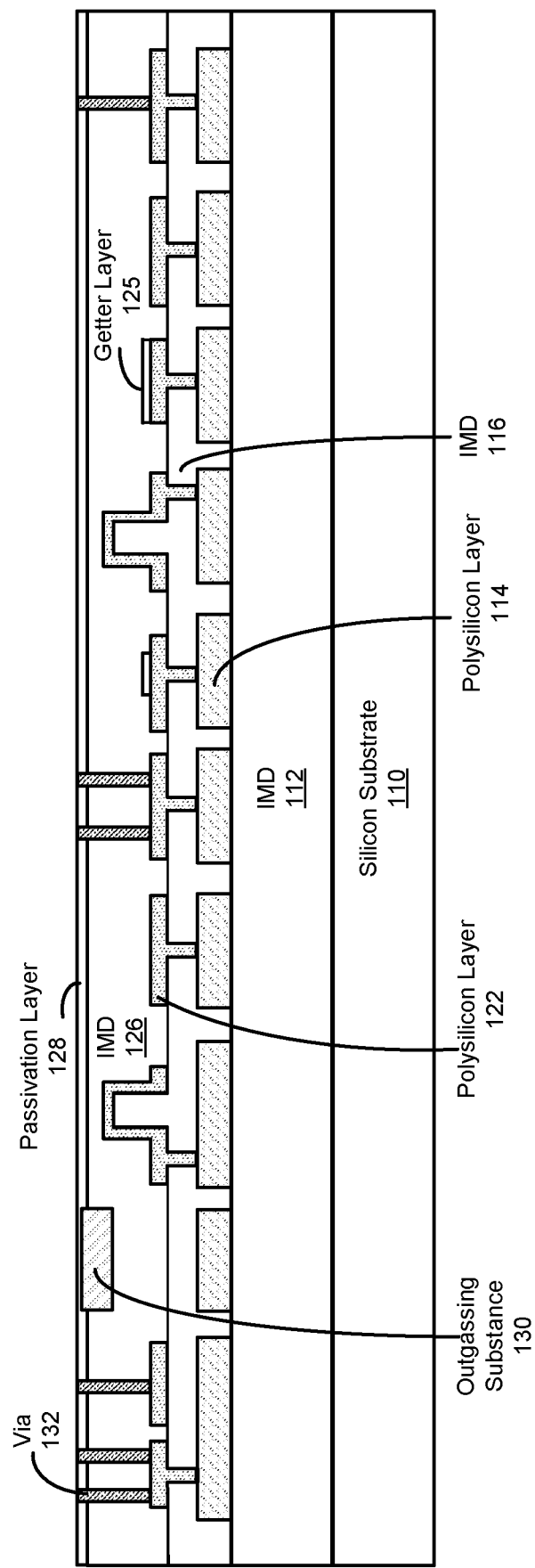

Referring now to FIG. 14, one or more vias 132 may be formed through passivation layer 128 and further through the IMD layer 126 to expose the patterned polysilicon layer 122 underneath. It is appreciated that a mask may be used, patterned, and ultimately etched through to form the vias 132. It is appreciated that formation of xix vias 132, as shown, is for illustration purposes only and should not be construed as limiting the scope of the embodiments. For example, less than six vias or more than six vias may be formed as needed. According to some embodiments, the vias 132 may be lined with a liner barrier, e.g., Ti, TiN, etc. Once optionally lined, the vias 132 may be filled with a filling material, e.g., Tungsten. Once filled, a CMP process may be performed or etch back process may be performed. It is appreciated that in some optional embodiments, another layer of liner barrier, e.g., Ti, TiN, etc., may be formed to cover the vias 132 and the passivation layer 128.

Figure 15:
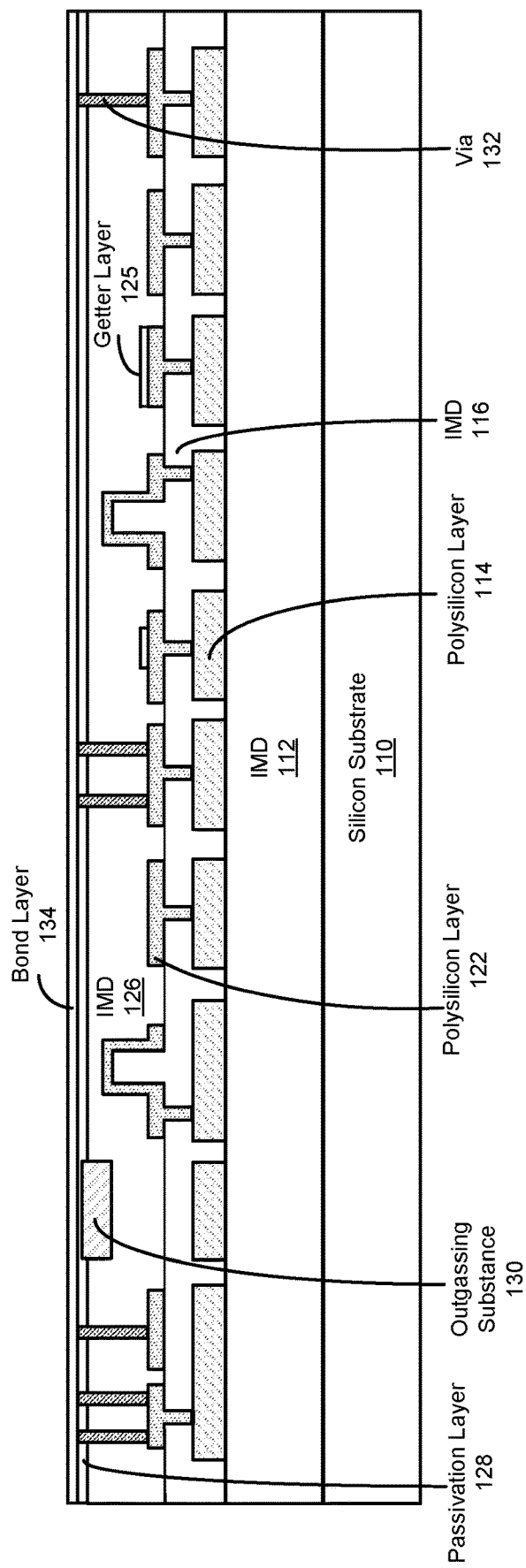
Figure 16:
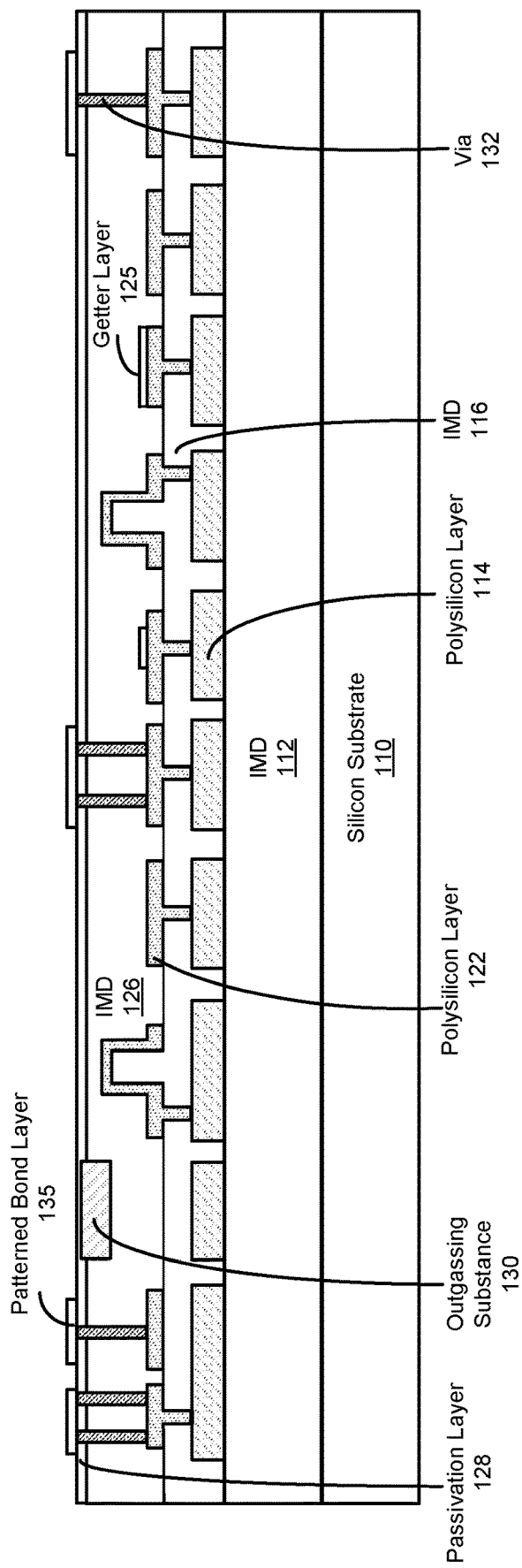

Referring now to FIG. 15, a bond layer 134 may be deposited over the passivation layer 128. The bond layer 134 may be used for bonding to another substrate, described later in this application. The bond layer 134 may include material such as Al, AlCu, Germanium, etc. Referring now to FIG. 16, the bond layer 134 may be patterned to form a patterned bond layer 135. In some embodiments, a mask may be patterned and the bond layer 134 that is exposed may be etched away to form the patterned bond layer 135. In one nonlimiting example, the patterned bond layer 135 is formed over the vias 132. The outgassing substance 130 may be protected with the remaining protective passivation layer after the bond layer patterning (the protective layer is partially etched during the bond layer patterning).

Figure 17:
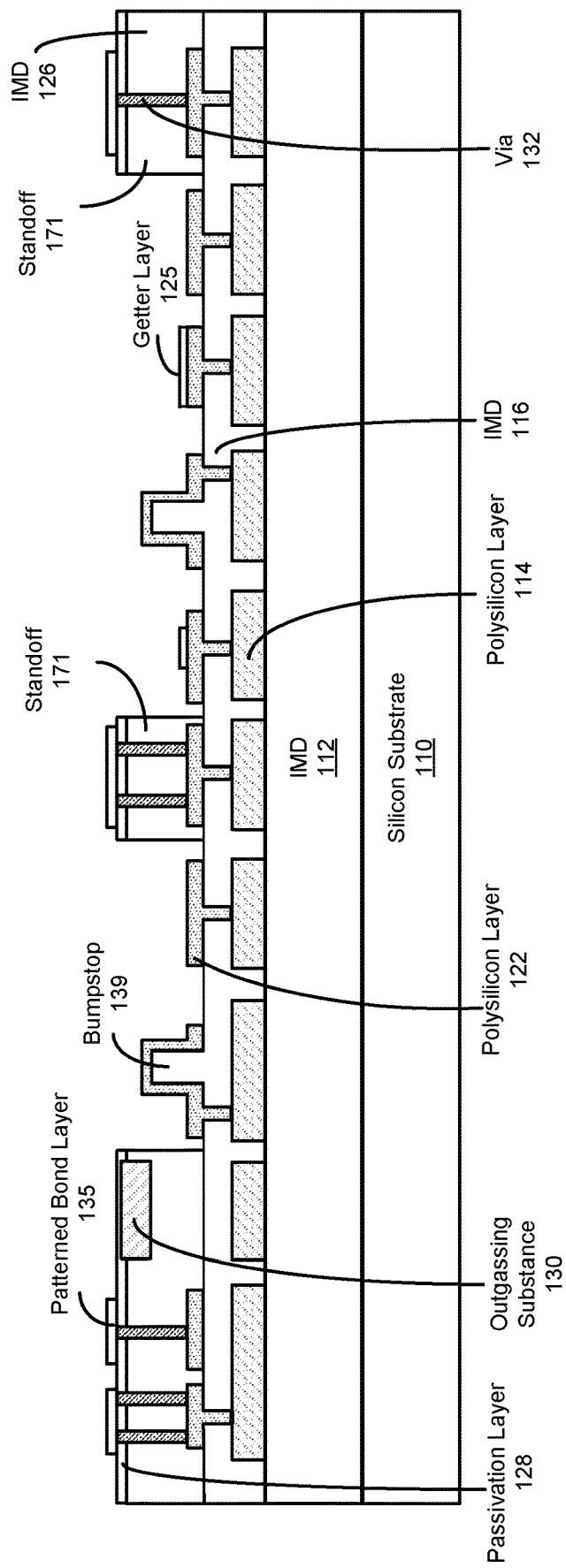

Referring now to FIG. 17, a mask may be deposited over the patterned bond layer 135 and the passivation layer 128, and the mask may be subsequently patterned. A portion of the passivation layer 128 and the IMD layer 126 underneath the passivation layer 128 that is not covered by the mask, i.e., exposed, may be etched away. As such the bumpstop 139 formed from the IMD 126 layer and which is covered by the polysilicon layer 122 is exposed. Moreover, the getter layer 125 covering the polysilicon layer 122 is also exposed. It is appreciated that the patterned polysilicon layer 122 may also be exposed. The polysilicon layer 122 that is exposed are electrodes that are formed within the cavities. It is appreciated that etching a portion of the IMD layer 126 forms the standoffs 171 on the substrate as opposed to the MEMS device layer.

Figure 18A:
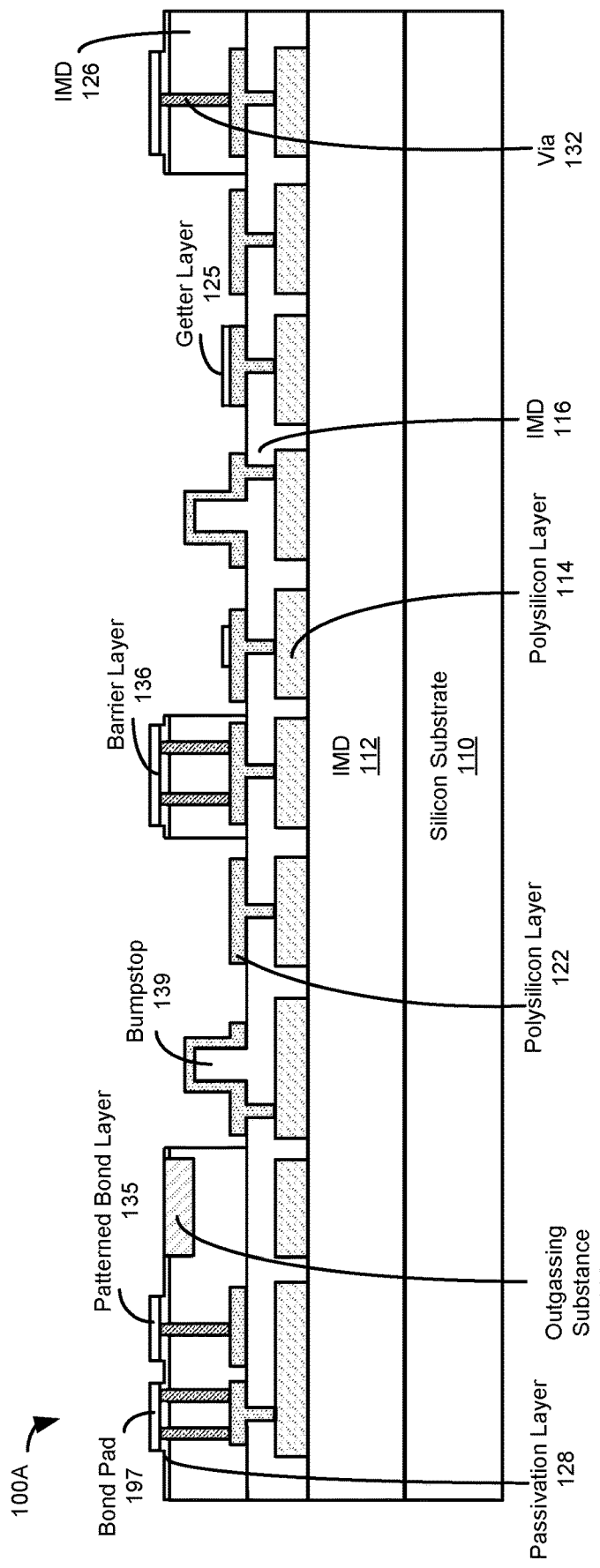
Figure 18B:
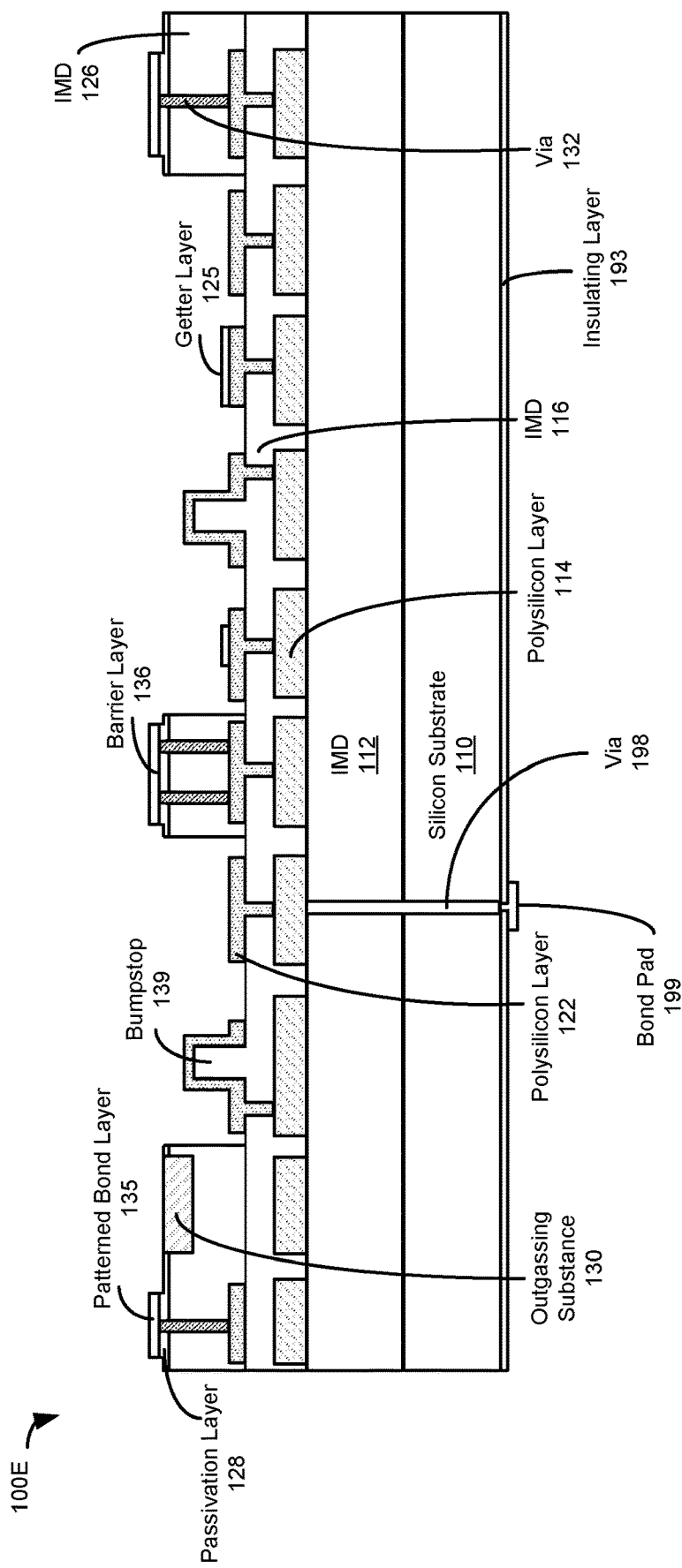

Referring now to FIG. 18A, a blanket etch may be performed on the passivation layer in order to expose the outgassing substance 130. Prior to the blanket etch process, an optional anneal step may be performed to induce outgassing from the exposed surfaces. In other embodiment, an anneal step and blanket etch on the passivation layer may be performed after the bond layer patterning and before the passivation layer 128 and the IMD layer 126 etch. In this embodiment, the barrier layer 136 is shown for a nonlimiting example where a liner barrier was optionally deposited over the passivation layer 128. As illustrated the substrate 100A is formed that can be bonded to a MEMS layer. Also, it is appreciated that the bond layer 135 may form a bond pad 197 for making connections to other external devices, e.g., a CMOS chip, or PCB. Referring now to FIG. 18B, an alternative of substrate 100A is illustrated as the substrate 100D. In substrate 100D, the bond pad 199 is formed on the opposite side of the silicon substrate 110 instead of being disposed on the same side as illustrated in bond pad 197 of FIG. 18A, thereby saving space and reducing chip size. The bond pad 199 may be formed by forming a through-silicon-via (TSV) 198 in the silicon substrate 110 before deposition of the polysilicon layer 114. For example, the TSV 198 may be etched and insulated by forming an insulating layer, e.g., oxide, on the formed TSV 198. A conductive layer, e.g., polysilicon, Ti, TiN, Cu, etc., may be deposited within the TSV 198. The TSV 198 may be exposed after bonding the substrate 100D to a MEMS layer 138 (similar to bonding the substrate 100A to the MEMS layer 138 described in FIG. 20) and thinning the silicon substrate 110. Once the TSV 198 is exposed, an insulating layer such as oxide may be deposited and patterned to prepare the other side of the silicon substrate 110 for bond pad deposition. Once prepared, a bond layer is deposited and patterned to form the bond pad 199. In some embodiments, bond pad 199 may be formed by forming the TSV 198 in the silicon substrate 110 after bonding the substrate 100D to a MEMS layer 138. It is appreciated that in some embodiments the TSV 198 and the bond pad 199 are formed over the insulating layer 193

Figure 19:
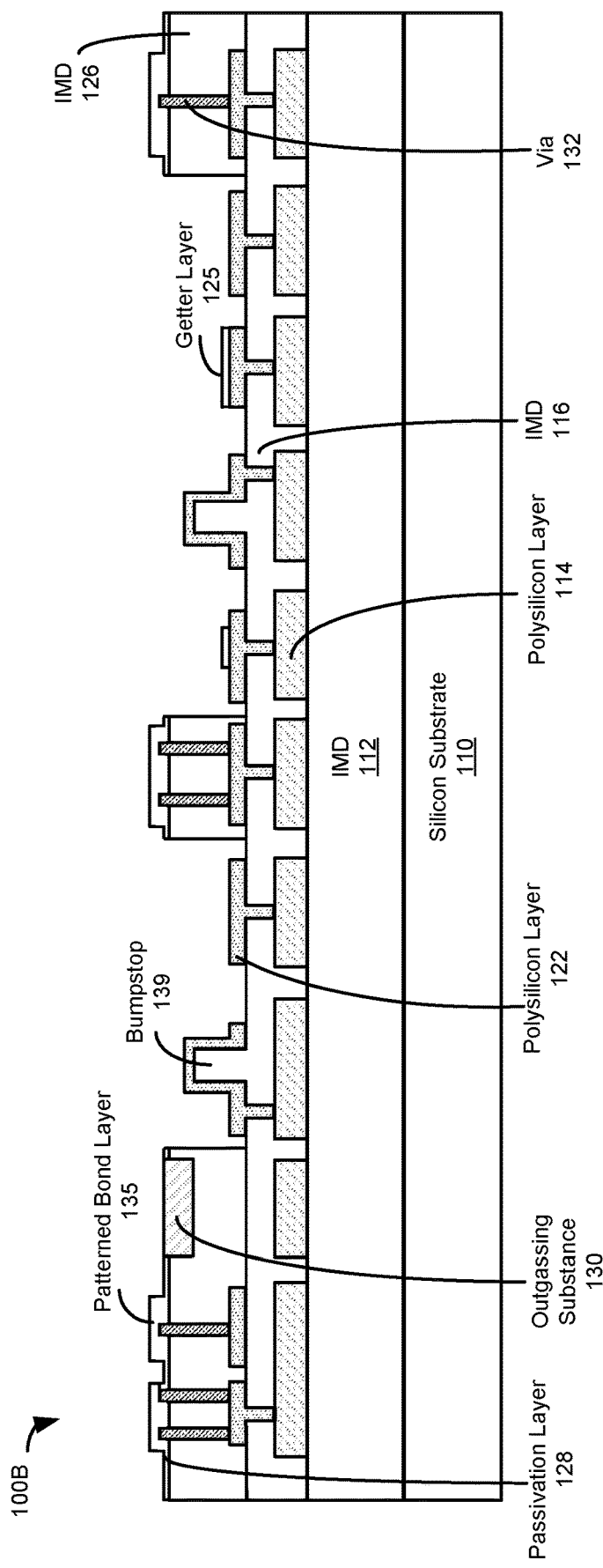

Referring now to FIG. 19, the blanket etch of the passivation layer to expose the outgassing substance 130 is shown where the liner barrier is not used. As illustrated, the substrate 100B is formed that can be bonded to a MEMS layer.

Figure 20:
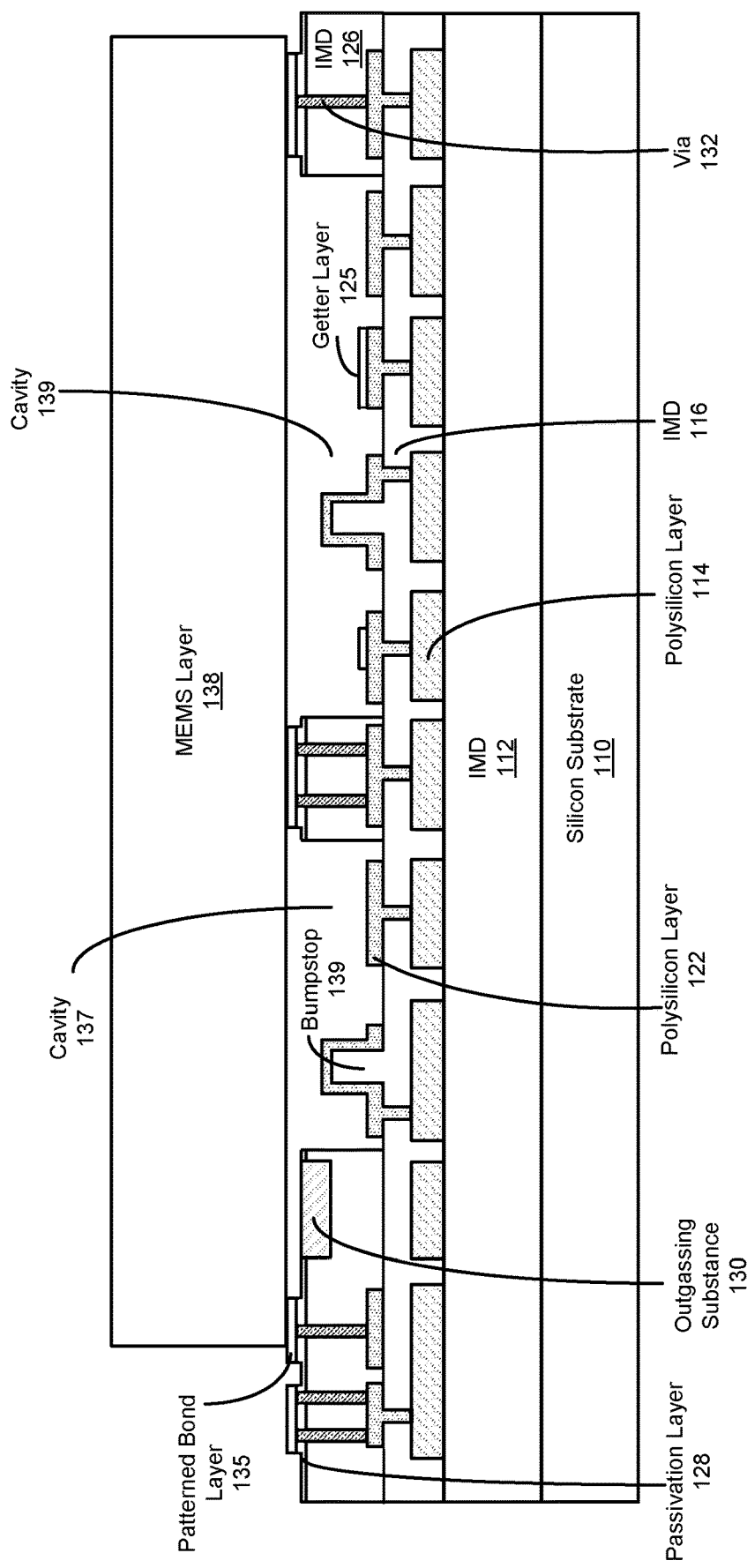
FIG. 20 shows a bonding of the substrate to a MEMS layer according to one aspect of the present embodiments.

Referring now to FIG. 20, a bonding of the substrate 100A of FIG. 18 to a MEMS layer 138 according to one aspect of the present embodiments. Once bonded, two cavities 137 and 139 may be formed. It is appreciated that cavity 139 may be used for gyro application while the cavity 137 may be used for accelerometer. It is appreciated that the substrate 100B and 100C of FIGS. 18B and 19 may similarly be bonded to the MEMS layer 138.

Figure 21:
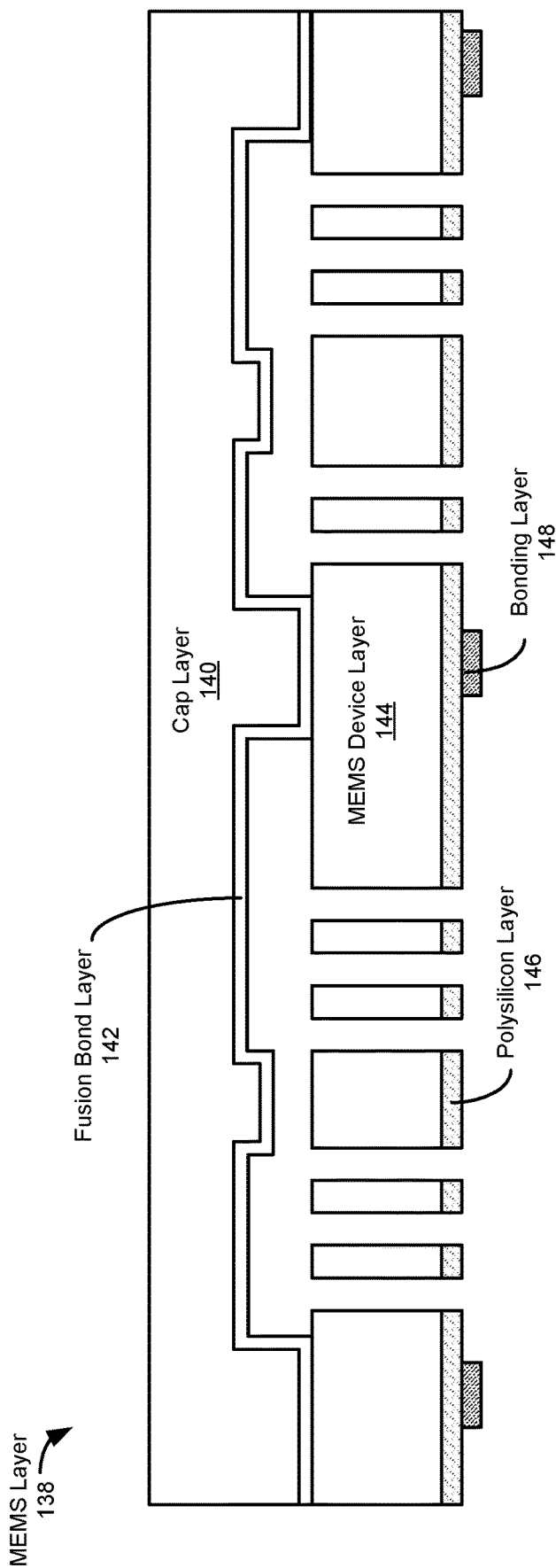
FIG. 21 shows a MEMS layer according to one aspect of the present embodiments.

One nonlimiting example of the MEMS layer 138 is shown in FIG. 21. The MEMS layer 138 may include a cap layer 140 and a MEMS device layer 144. The cap layer 140 may be coupled to the MEMS device layer 144 via the fusion bond layer 142. In some embodiments, one surface of the MEMS device layer 144 may be coated with a polysilicon layer 146 in order to improve stiction. A portion of the polysilicon layer 146 may be coated with a bonding layer 148, e.g., Al, AlCu, Germanium, etc., in order to bond to the bond layer 135 of the substrate 100A or 100B. It is appreciated that after the MESM layer 138 is bonded to the substrate 100A or 100B, the bonded device may go through a wafer thinning process, tab dicing to expose the bond pads in the substrate wafer, etc.

Accordingly, as illustrated, polysilicon electrodes and interconnects are formed to reduce hillocks and eliminate the need to form slotting. Moreover, as illustrated, the polysilicon layer used (e.g., on the bumpstop and also on movable structures of the MEMS device layer) improves stiction due to poly-to-poly contact. It is appreciated that use of the outgassing substance and/or a getter layer also improves the stability of the cavity pressures. Moreover, forming the standoff on the substrate as opposed to the MEMS device layer improves lithography of the MEMS device layer by eliminating photoresist pooling.

Figure 24:
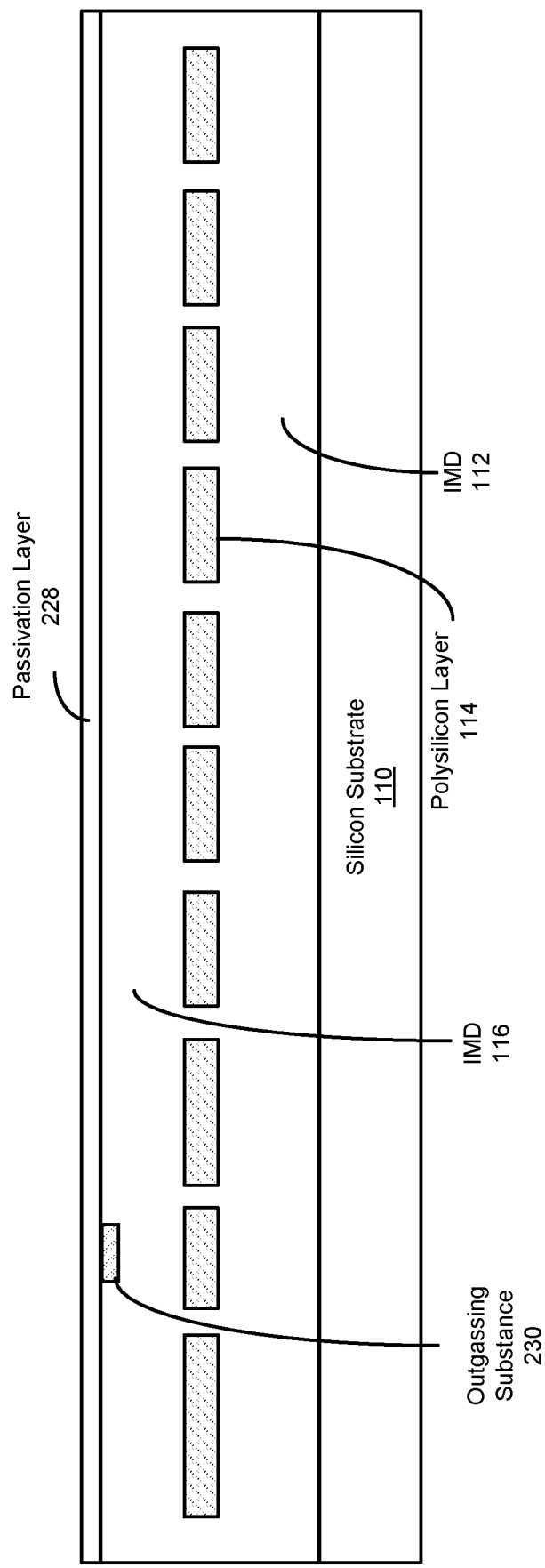

Referring now to FIGS. 22-34, fabrication process for a substrate with a standoff, bumpstop with improved stiction, and polysilicon electrodes according to another aspect of the present embodiments is shown. FIG. 22 is similar to that of FIG. 4, as described above. Referring now to FIG. 23, a portion of the IMD 116 layer may be etched and HDP may be deposited within the etched portion of the IMD 116 layer to form the outgassing substance 230. It is appreciated that in some embodiment, a mask may be patterned over the IMD 116 layer where the patterned mask covers the IMD 116 layer except for the exposed portion that corresponds to the outgassing substance. Once the exposed portion is etched, HDP may be deposited to form the outgassing substance 230. It is appreciated that a passivation layer 228 may deposited over the outgassing substance 230 as well on the IMD 116 layer in order to protect the outgassing substance 230 from being damaged in subsequent fabrication process, as illustrated in FIG. 24. It is appreciated that the passivation layer 228 may include SiN. It is appreciated that the HDP may be used as outgassing substance.

Figure 25:
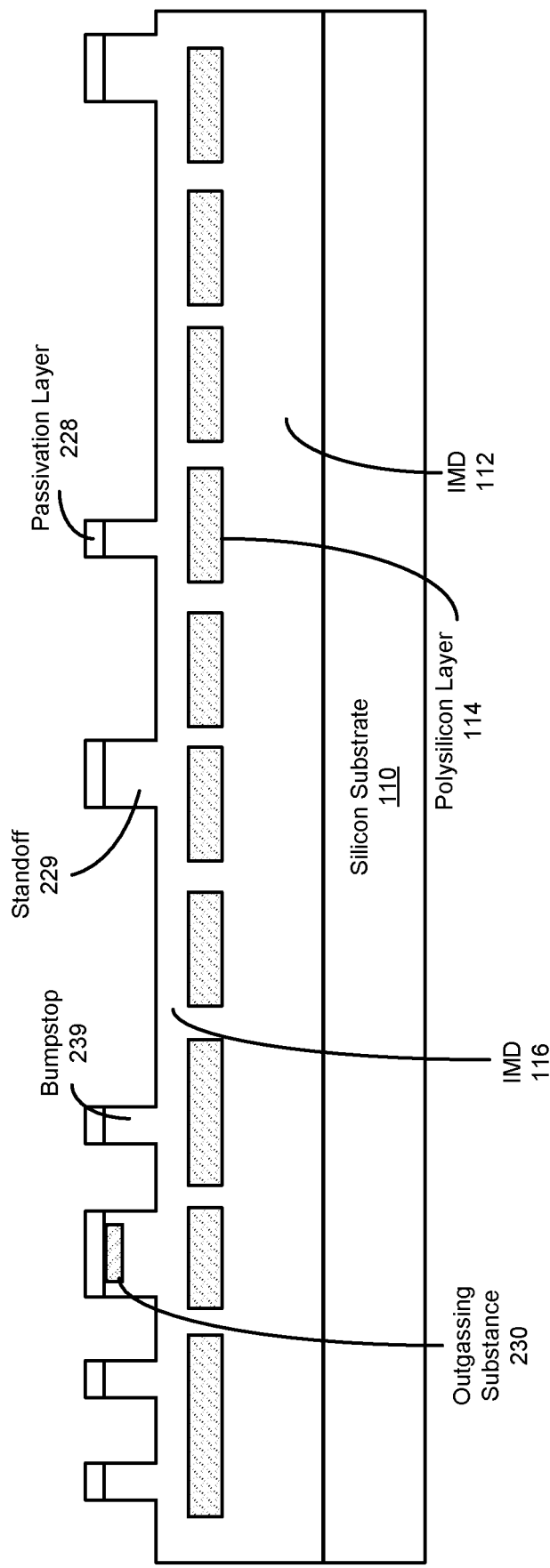
Figure 26:
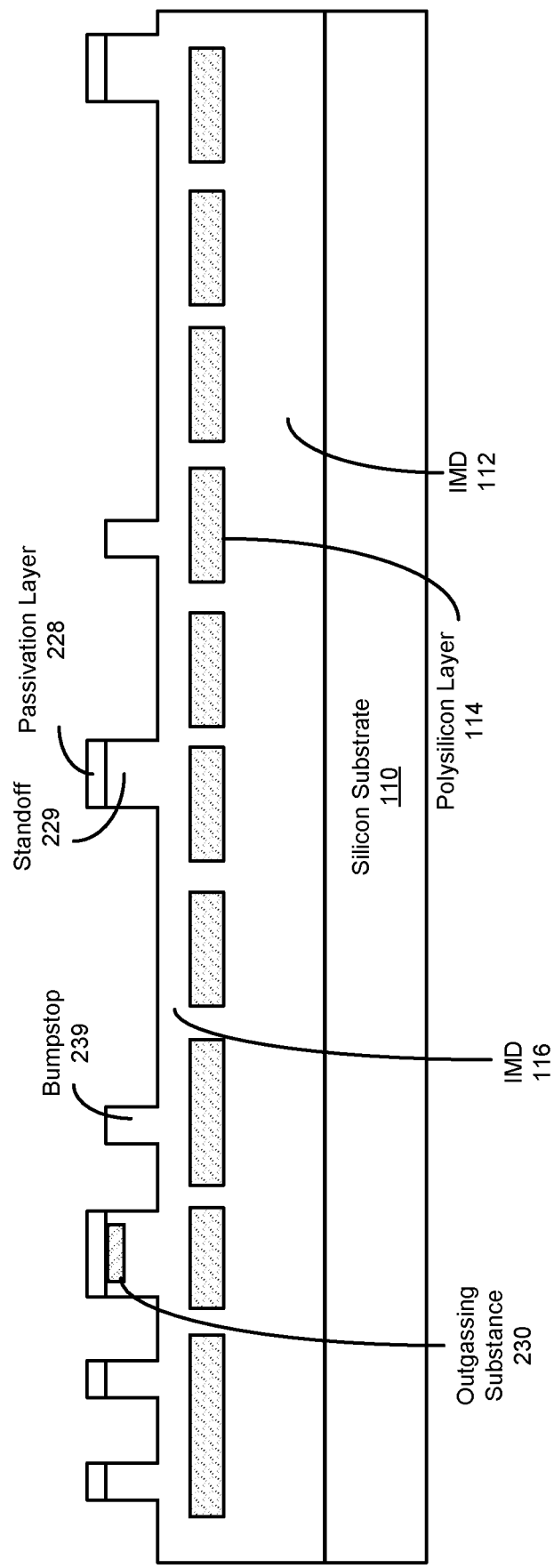

Referring now to FIG. 25, the passivation layer 228 may be patterned where the covered portions of the patterned passivation layer 228 correspond to standoff regions and the bumpstop regions. Once the exposed portions of the passivation layer 228 and the IMD layer 116 corresponding to the exposed portion are etched based on the patterned mask, the bumpstops 239 and the standoffs 229 are formed. Referring now to FIG. 26, the passivation layer 228 and the partial IMD layer 116 over the bumpstops 239 is removed to expose the bumpstops 239.

Figure 27:
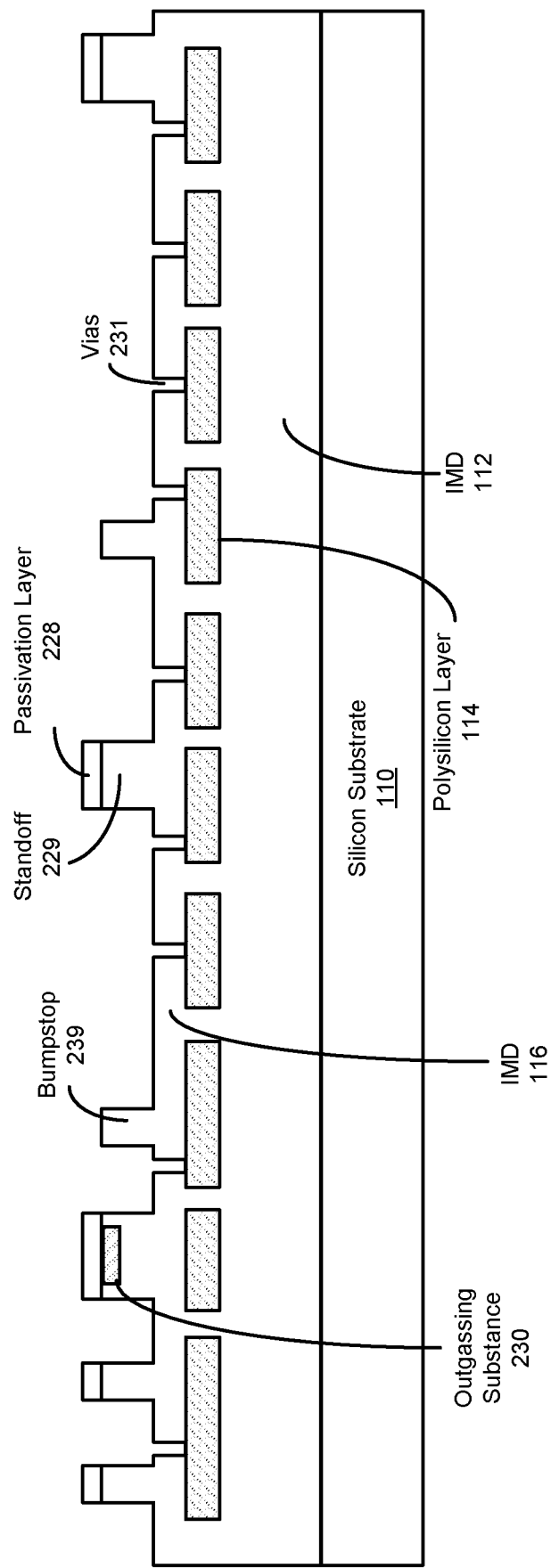
Figure 28:
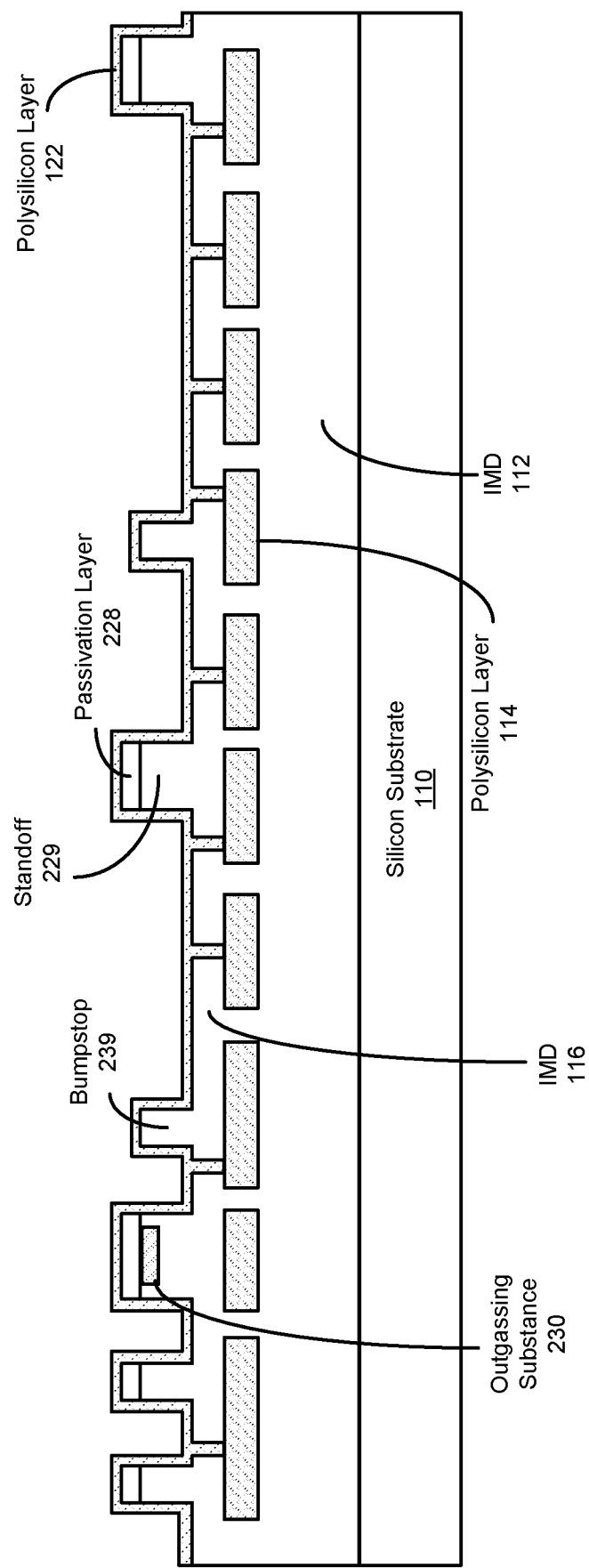

Referring now to FIG. 27, a mask may be deposited over the passivation layer 228, the bumpstops 239, etc. and may be patterned where the exposed portions of the IMD layer 116 correspond to the vias to be formed. The exposed portions of the IMD layer 116 may be etched in order to form the vias 231 and to expose the polysilicon 114 layer underneath. Referring now to FIG. 28, the polysilicon layer 122 is deposited over the passivation layer 228, the IMD layer 116 and further on the exposed portions of the polysilicon layer 114. The polysilicon layer 122 covers the bumpstops 239 and the standoffs 229 and connects to the polysilicon layer 114.

Figure 29:
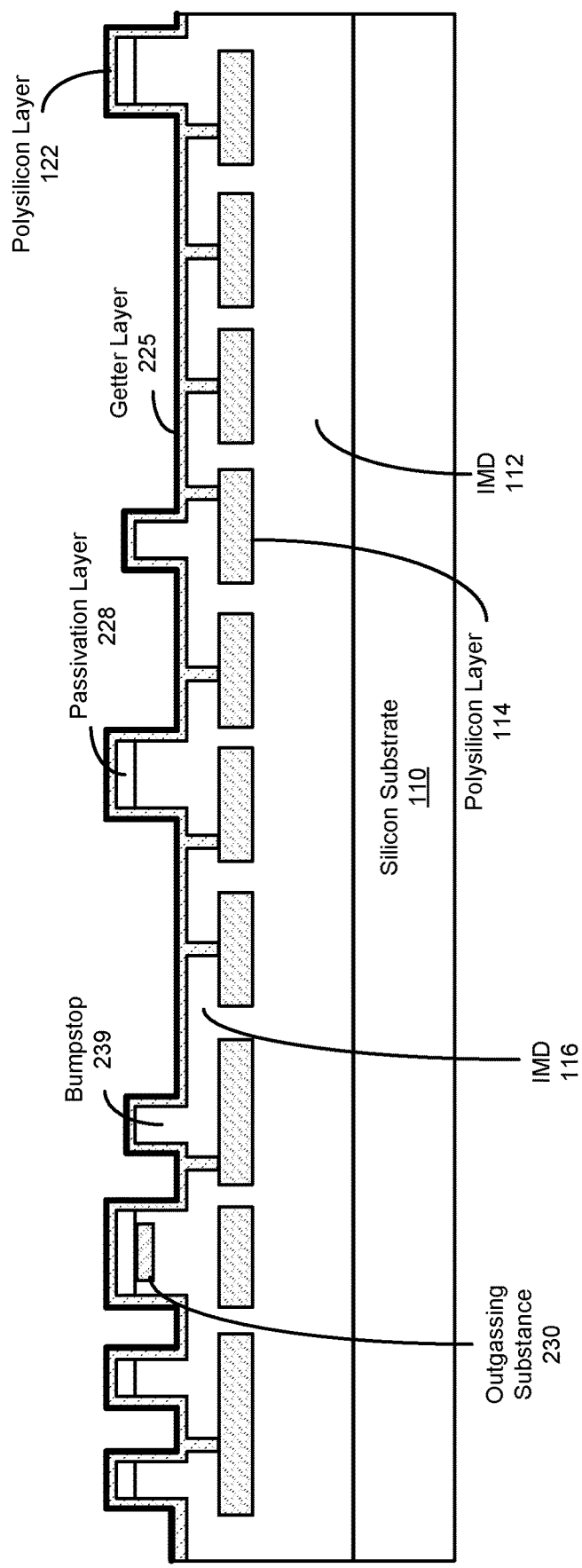
Figure 30:
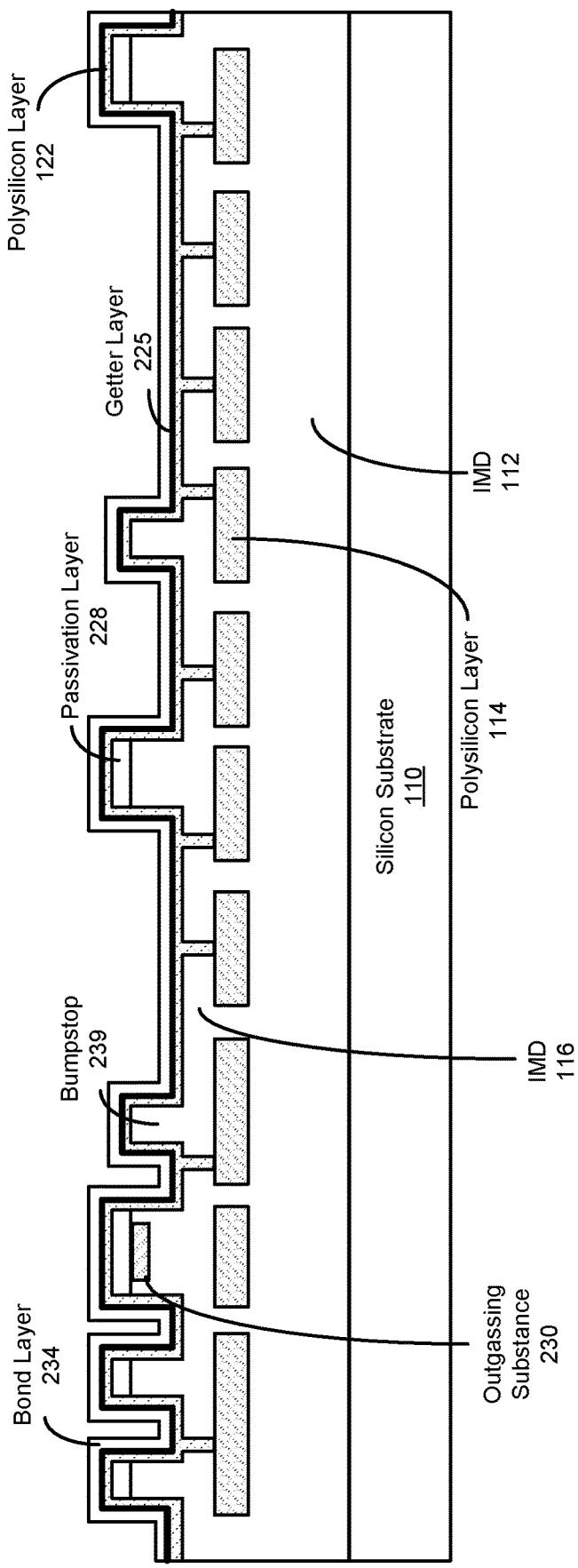
Figure 31:
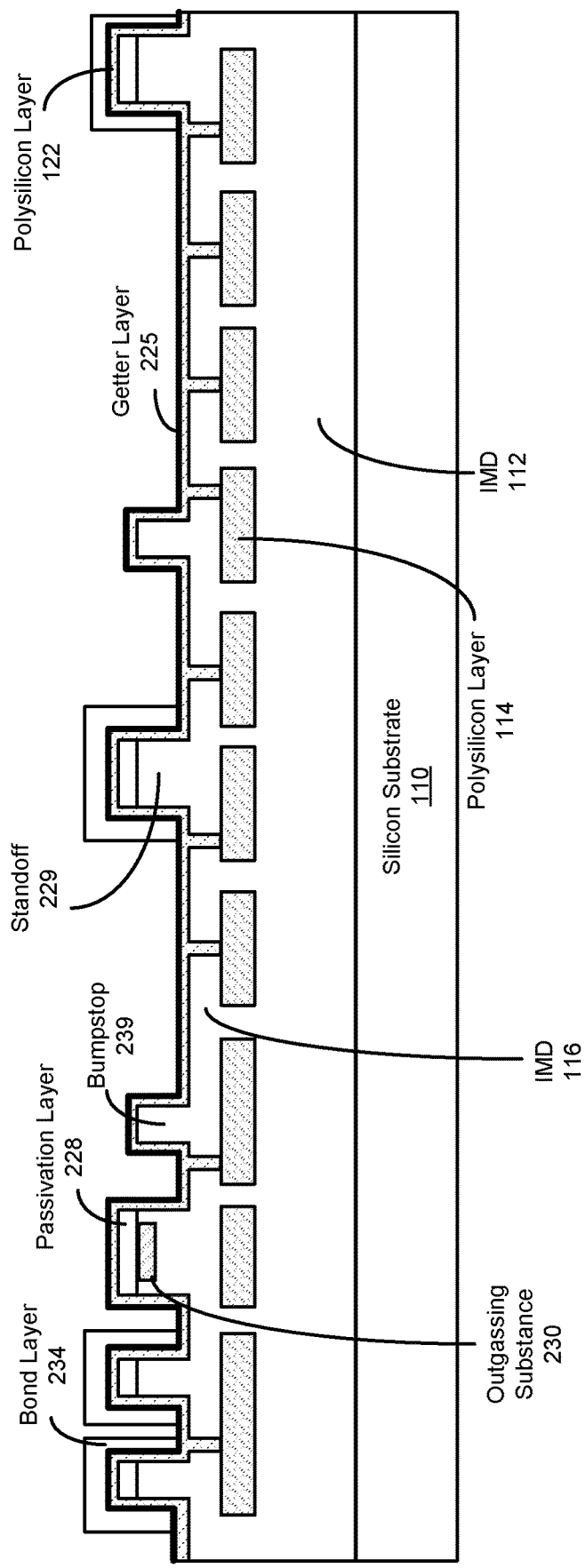
Figure 32:
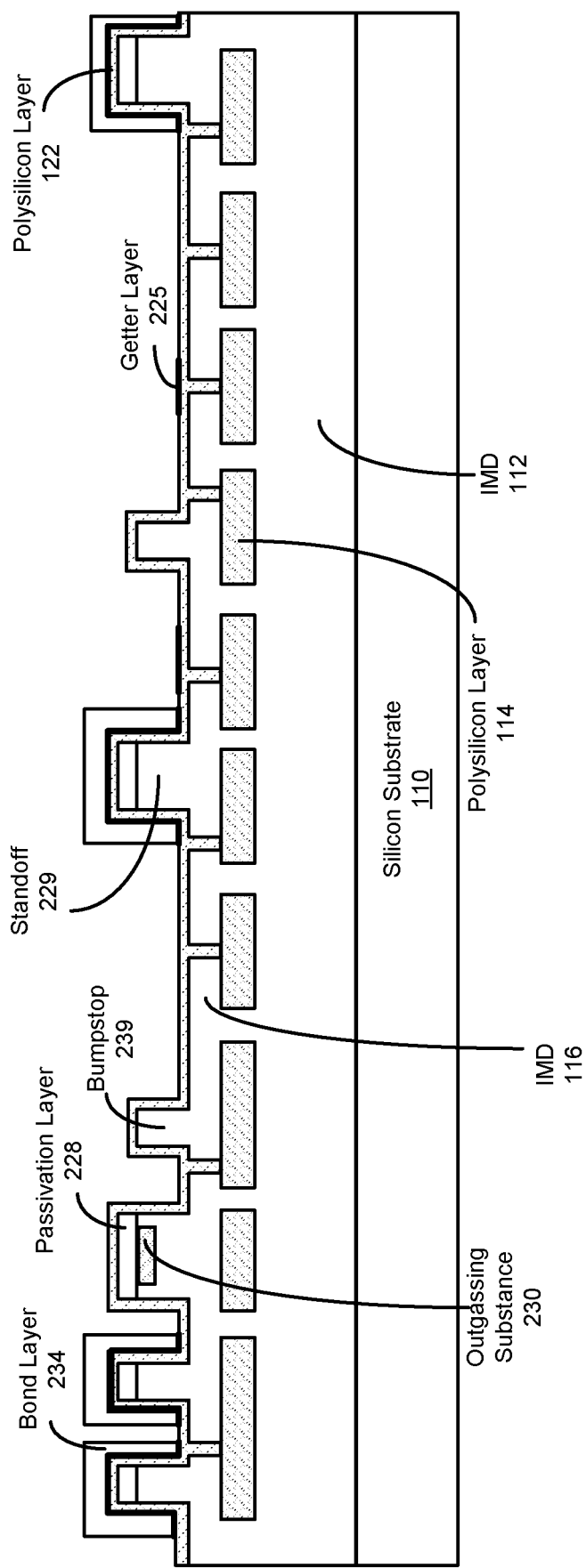

Referring now to FIG. 29, a getter layer 225 may be deposited over the polysilicon layer 122. The getter layer 225 may include Ti, TiN, or other similar material. Referring now to FIG. 30, a bond layer 234 may be deposited over the getter layer 225. The bond layer 234 may include material such as Al, AlCu, Ge, etc. Referring now to FIG. 31, a mask may be deposited over the bond layer 234 and subsequently patterned to cover the standoffs 229. Referring now to FIG. 32, the getter layer 225 is patterned using a patterned mask. In one nonlimiting example, a portion of the getter layer 225 in the region corresponding to the gyro cavity is covered and the rest of the getter layer 225 is etched away.

Figure 33:
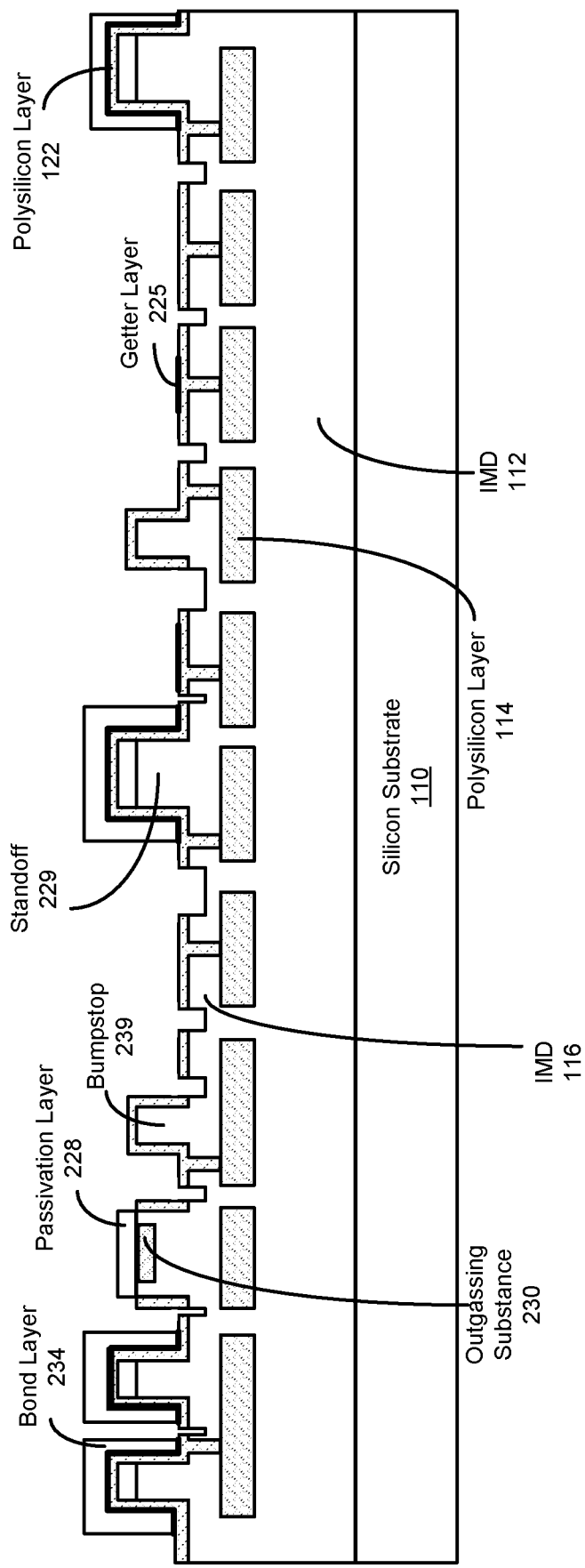
Figure 34A:
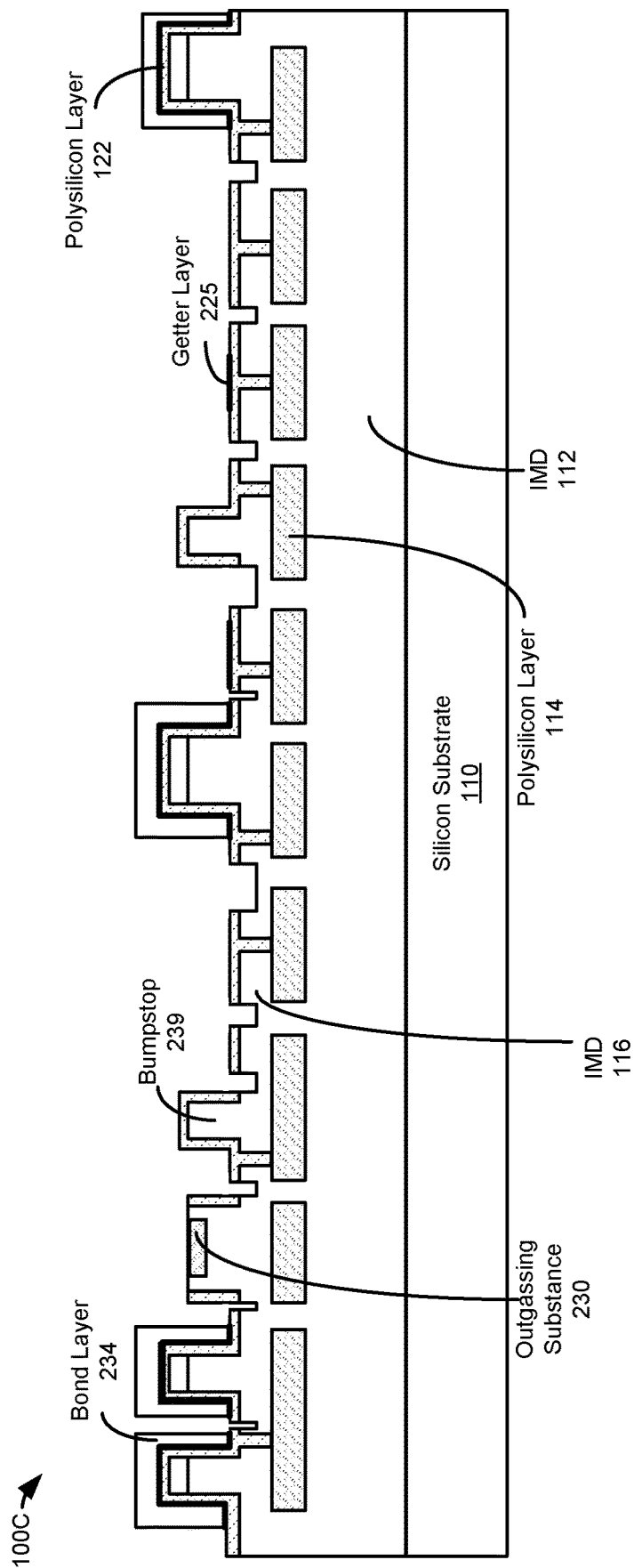

Referring now to FIG. 33, a patterned mask may be used to pattern the polysilicon layer 122 to form a set of polysilicon layers. It is appreciated that a portion of the polysilicon layers 122 as well as a portion of the IMD layer 116 are etched away to form a plurality of polysilicon layers 122. Moreover, the polysilicon layer covering the outgassing substance 230 is also etched away. It is appreciated that the polysilicon layer covering the bumpstop 239 improves stiction by creating a poly-to-poly contact with the movable portions of the MEMS device layer that are also include polysilicon. Moreover, the polysilicon layer that are now exposed form electrodes associated with each cavity, e.g., gyro cavity, accelerometer cavity, etc. Electrodes that are made of polysilicon reduce hillocks and eliminate the need to form slotting to address hillocks effect as described above. Referring now to FIG. 34A, the passivation layer 228 covering the outgassing substance 230 is removed, e.g., blanket etch process, to expose the outgassing substance 230. Accordingly, the substrate 100C is formed.

Figure 34B:
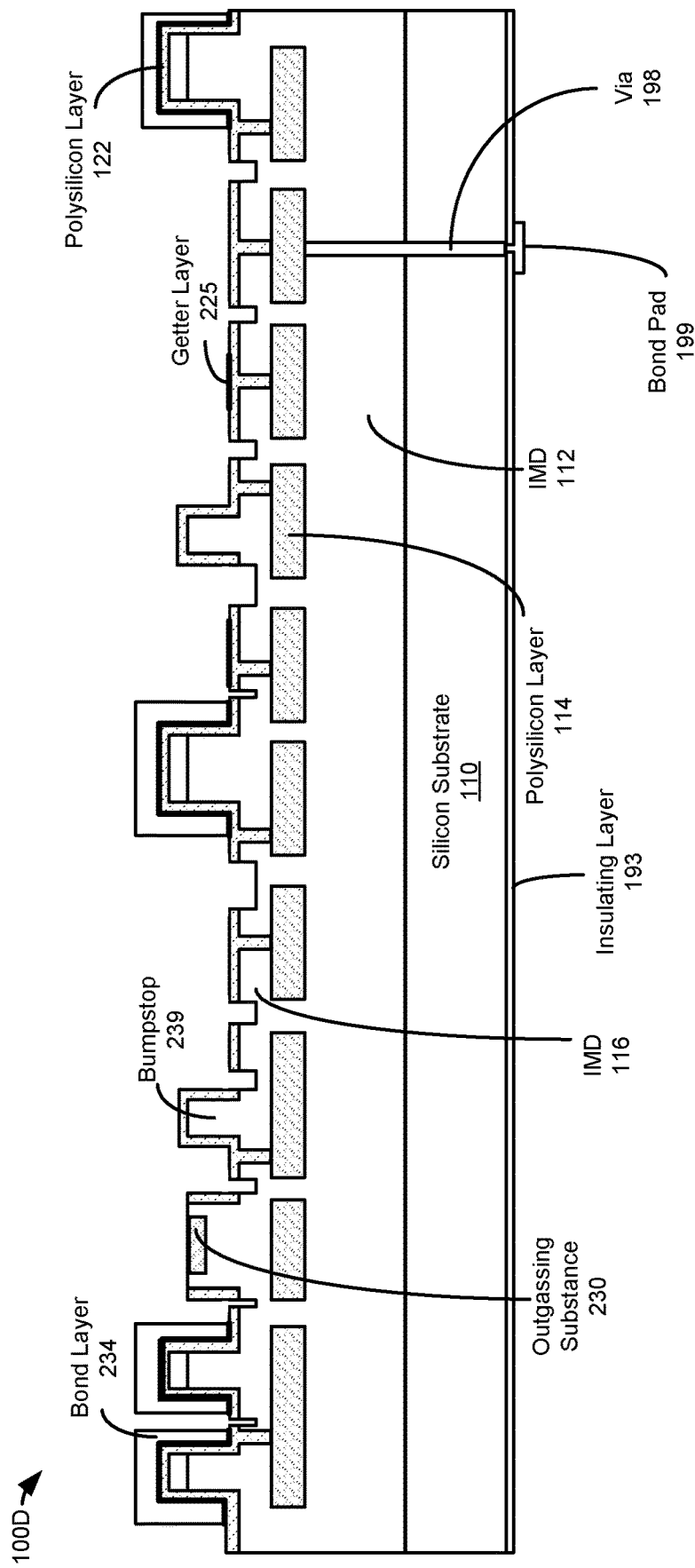

Referring now to FIG. 34B, an alternative of substrate 100C is illustrated as the substrate 100D. In substrate 100D, the bond pad 199 is formed on the opposite side of the silicon substrate 110 instead of being disposed on the same side as illustrated in bond pad 197 of FIG. 34A, thereby saving space and reducing chip size. The bond pad 199 may be formed by forming a through-silicon-via (TSV) 198 in the silicon substrate 110 before deposition of the polysilicon layer 114. For example, the TSV 198 may be etched and insulated by forming an insulating layer, e.g., oxide, on the formed TSV 198. A conductive layer, e.g., polysilicon, Ti, TiN, Cu, etc., may be deposited within the TSV 198. The TSV 198 may be exposed after bonding the substrate 100D to a MEMS layer 138 (similar to bonding the substrate 100C to the MEMS layer 138 described in FIG. 35) and thinning the silicon substrate 110. Once the TSV 198 is exposed, an insulating layer such as oxide may be deposited and patterned to prepare the other side of the silicon substrate 110 for bond pad deposition. Once prepared, a bond layer is deposited and patterned to form the bond pad 199. In some embodiments, bond pad 199 may be formed by forming the TSV 198 in the silicon substrate 110 after bonding the substrate 100D to a MEMS layer 138. It is appreciated that in some embodiments the TSV 198 and the bond pad 199 are formed over the insulating layer 193.

Figure 35:
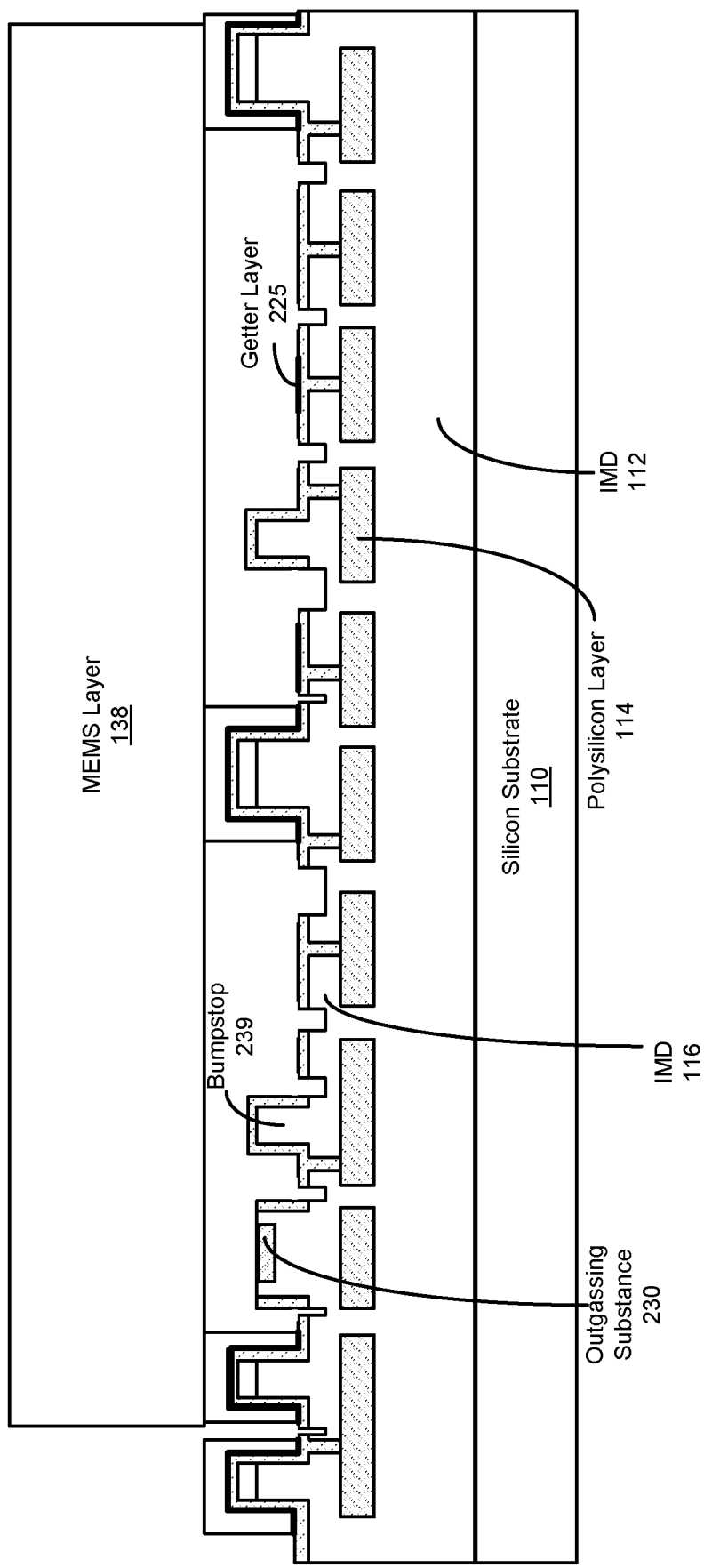
FIG. 35 shows a bonding of the substrate to a MEMS layer according to another aspect of the present embodiments.

FIG. 35 shows a bonding of the substrate 100C to a MEMS layer 138 according to another aspect of the present embodiments. Accordingly, bonding the substrate 100C to the MEMS layer 138, as described above in FIGS. 20 and 21 forms the enclosed cavities associated with gyro and accelerometer. It is appreciated that the use of the MEMS 138 as illustrated above is for illustration purposes only and should not be construed as limiting the scope of the embodiments. It is appreciated that in some embodiments, the bond pad of substrate 100C may be formed on the opposite side of the silicon substrate 110, as described in FIG. 18B. Accordingly, the chip size may be reduced.

Figure 36A:
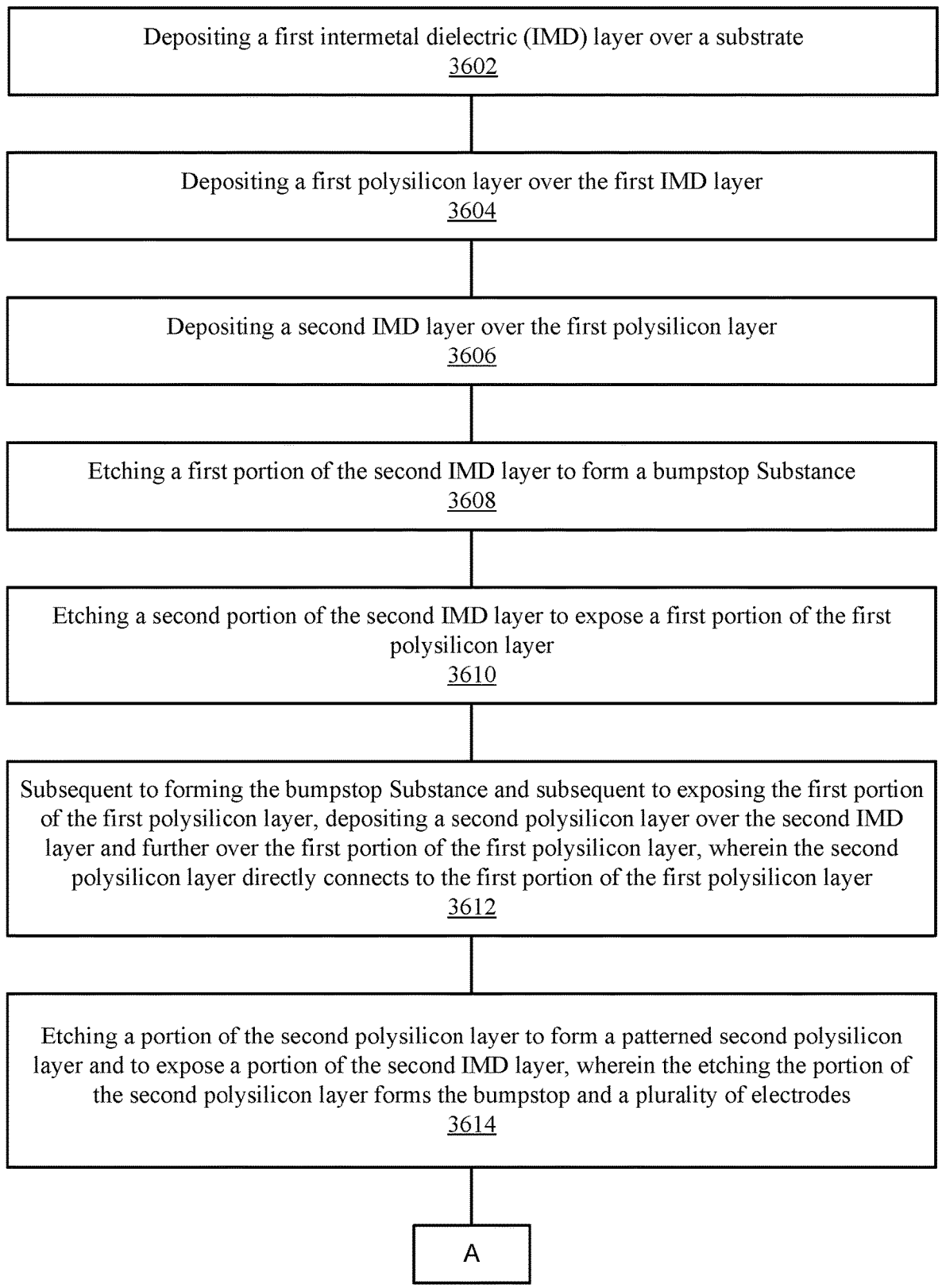
FIGS. 36A-36B show a flow diagram for fabricating a substrate with a standoff, bumpstop with improved stiction, and polysilicon electrodes according to one aspect of the present embodiments.
Figure 36B:
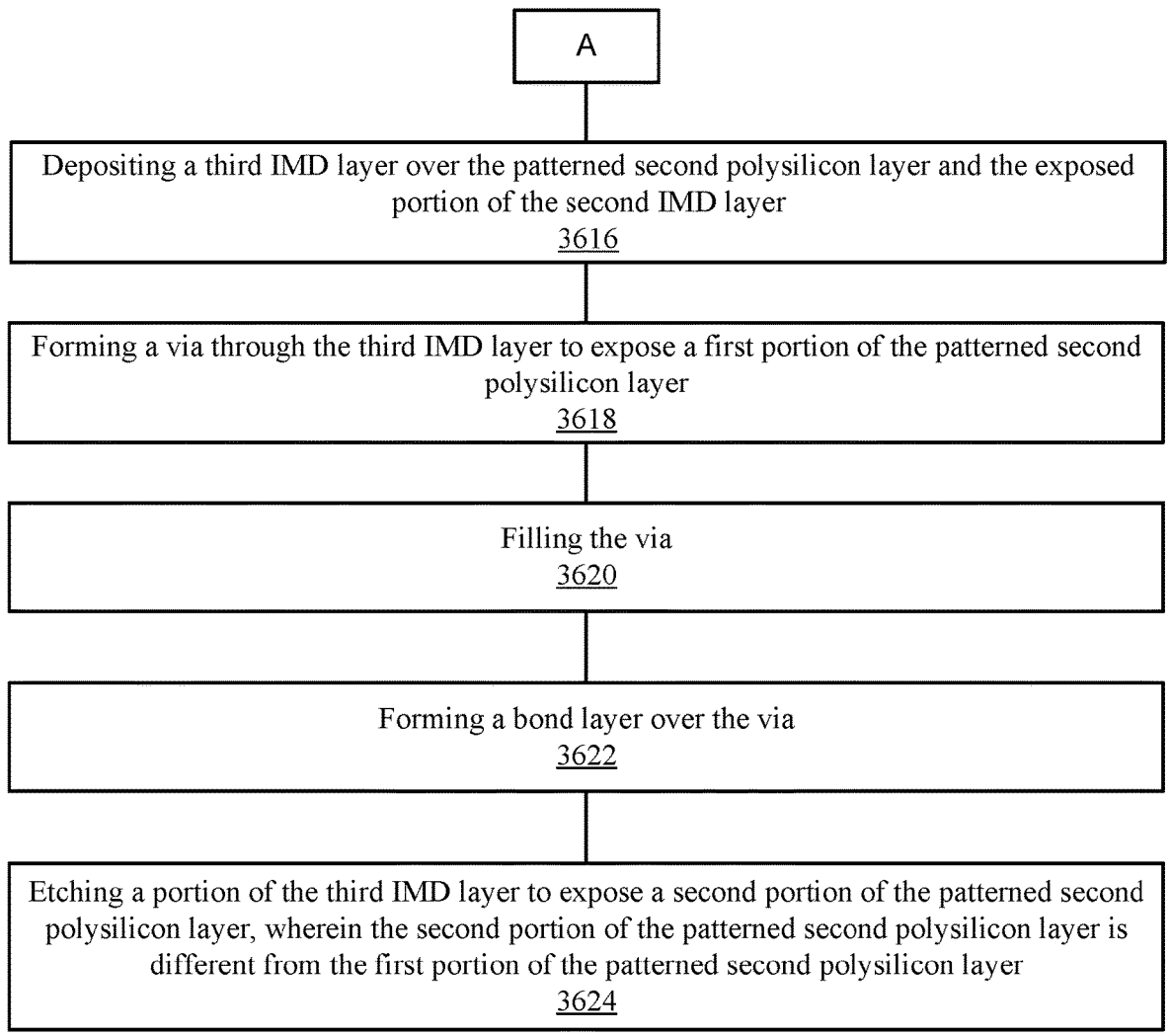

Referring now to FIGS. 36A-36B, a flow diagram for fabricating a substrate with a standoff, bumpstop with improved stiction, and polysilicon electrodes according to one aspect of the present embodiments is shown and as described in FIGS. 1-21. At step 3602, a first intermetal dielectric (IMD) layer is deposited over a substrate, as described above. At step 3604, a first polysilicon layer is deposited over the first IMD layer and is etched to form a patterned first polysilicon layer, as described above. At step, 3606, a second IMD layer is deposited over the first polysilicon layer and the exposed first IMD layer, as described above. At step 3608, a first portion of the second IMD layer is etched to form a bumpstop region, as described above. At step 3610, a second portion of the second IMD layer is etched to expose a first portion of the first polysilicon layer, as described above. At step 3612, subsequent to forming the bumpstop region and subsequent to exposing the first portion of the first polysilicon layer, a second polysilicon layer is deposited over the second IMD layer and further over the first portion of the first polysilicon layer. It is appreciated that the second polysilicon layer may directly connect to the first portion of the first polysilicon layer. At step 3614, a portion of the second polysilicon layer is etched to form a patterned second polysilicon layer and to expose a portion of the second IMD layer. It is appreciated that the etching the portion of the second polysilicon layer forms the bumpstop and a plurality of electrodes. At step 3616, a third IMD layer is deposited over the patterned second polysilicon layer and the exposed portion of the second IMD layer. At step 3618, a via is formed through the third IMD layer to expose a first portion of the patterned second polysilicon layer. At step 3620, the via is filled. At step 3622, a bond layer is formed over the via. At step 3624, a portion of the third IMD layer is etched to expose a second portion of the patterned second polysilicon layer. It is appreciated that the second portion of the patterned second polysilicon layer is different from the first portion of the patterned second polysilicon layer. It is appreciated that in some embodiments, a MEMS layer comprising a cap layer and a MEMS device layer structures may be bonded to the substrate, e.g., eutectic bonding in some nonlimiting examples.

It is appreciated that in some nonlimiting examples, a getter layer may be formed over an electrode. In some embodiments, a passivation layer comprising SiN may be deposited over the third IMD layer. It is appreciated that in some embodiments, an HDP may be deposited in the passivation and within the third IMD layer. It is appreciated that in some embodiments, the first IMD layer is patterned to form vias and the vias are filled with the first polysilicon layer to form the substrate contact.

Referring now to FIG. 37, yet another flow diagram for fabricating a substrate with a standoff, bumpstop with improved stiction, and polysilicon electrodes according to one aspect of the present embodiments is shown and as described in FIGS. 1-21. At step 3702, a bumpstop is formed from a first intermetal dielectric (IMD) layer and forming a via within the first IMD. The first IMD is disposed over a first polysilicon layer, and the first polysilicon layer is disposed over another IMD layer that is disposed over a substrate. At step 3704, a second polysilicon layer is deposited over the bumpstop and further over the via to connect to the first polysilicon layer, as described above. At step 3706, a standoff is formed over a first portion of the second polysilicon layer, as described above. It is appreciated that a second portion of the second polysilicon layer is exposed. At step 3708, a bond layer is deposited over the standoff.

It is appreciated that in some embodiments a MEMS layer comprising a MEMS device layer and a cap layer may be bonded to the substrate via the bond layer over the standoff. It is appreciated that the second portion of the second polysilicon layer is within a cavity formed after bonding. According to some embodiments the standoff may be formed by depositing a second IMD layer over the second polysilicon layer. A via may be formed by etching through the second IMD layer to expose a portion of the second polysilicon layer underneath the second IMD layer. It is appreciated that the via may be filled. In some nonlimiting example, another bond layer may be deposited covering the via and the second IMD layer. In some embodiments, the another bond layer is patterned. It is appreciated that a region associated with the standoff is covered by the another bond layer and the second IMD layer is etched that is uncovered by the another bond layer.

It is appreciated that in some embodiments, a passivation layer may be formed over the second IMD layer. The bond layer covers the passivation layer, and the passivation layer that is uncovered by the bond layer after patterning is etched. According to some embodiments, an outgassing material may be deposited within the second IMD layer. Moreover, in some embodiments, a getter layer may be formed over the second polysilicon layer.

Figure 38:
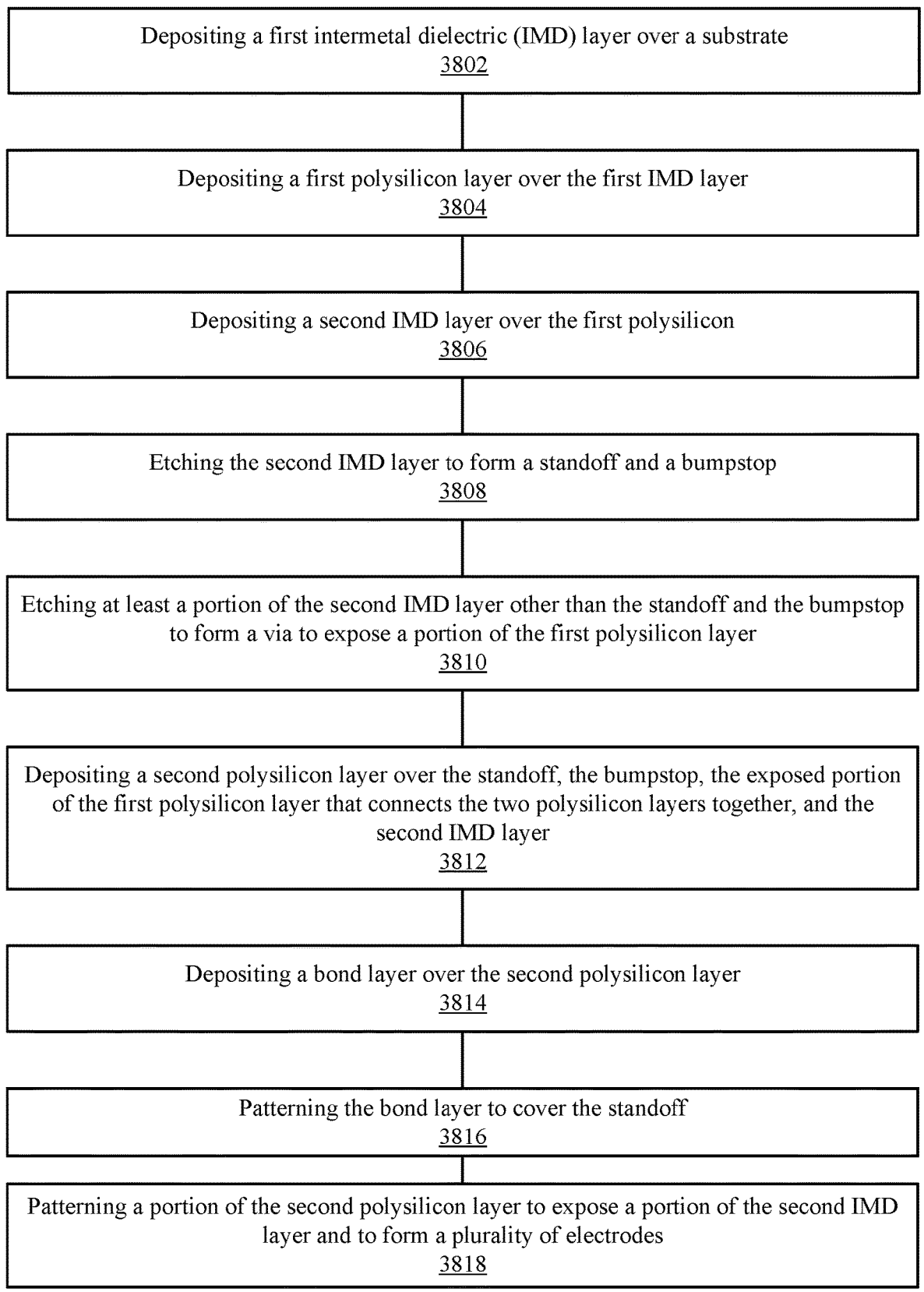
FIG. 38 shows a flow diagram for fabricating a substrate with a standoff, bumpstop with improved stiction, and polysilicon electrodes according to another aspect of the present embodiments.

Referring now to FIG. 38, a flow diagram for fabricating a substrate with a standoff, bumpstop with improved stiction, and polysilicon electrodes according to another aspect of the present embodiments is shown and as described in FIGS. 22-35. At step 3802, a first intermetal dielectric (IMD) layer is deposited over a substrate, as described above. At step 3804, a first polysilicon layer is deposited over the first IMD layer and is etched to form a patterned first polysilicon layer. At step 3806 a second IMD layer is deposited over the first polysilicon layer. At step 3808, the second IMD layer is etched to form a standoff and a bumpstop. At step 3810, at least a portion of the second IMD layer is etched other than the standoff and the bumpstop to form a via to expose a portion of the first polysilicon layer. At step 3812, a second polysilicon layer is deposited over the standoff, the bumpstop, the exposed portion of the first polysilicon layer that connects the two polysilicon layers together, and the second IMD layer. At step 3814, a bond layer is deposited over the second polysilicon layer. At step 3816, the bond layer is patterned to cover the standoff. At step 3818, a portion of the second polysilicon layer to expose a portion of the second IMD layer and to form a plurality of electrodes, as described above.

In some embodiments, a MEMS layer comprising a MEMS device layer and a cap layer is bonded to the standoff. It is appreciated that in some embodiments, a getter layer is formed over the second polysilicon layer prior to depositing the bond layer. In some embodiments, the getter letter may be patterned to expose a portion of the second polysilicon layer. In some embodiments, a passivation layer may be deposited over the second IMD layer prior to forming the standoff and the bumpstop. It is appreciated that in some embodiments, an outgassing substance may be formed within the second IMD layer prior to etching the least the portion of the second IMD layer. It is appreciated that in some embodiments, the first IMD layer is patterned to form vias and the vias are filled with the first polysilicon layer to form the substrate contact.

In the described embodiments, bond layer may comprise of Aluminum on one substrate and Germanium on the second substrate. Aluminum is bonded to germanium at high temperatures to form an eutectic bond. The eutectic bond forms a hermetic seal and provides electrical connection.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A method comprising:
   depositing a first intermetal dielectric (IMD) layer over a substrate;
   depositing a first polysilicon layer over the first IMD layer;
   depositing a second IMD layer over the first polysilicon layer;
   etching a first portion of the second IMD layer to form a bumpstop region;
   etching a second portion of the second IMD layer to expose a first portion of the first polysilicon layer;
   subsequent to forming the bumpstop region and subsequent to exposing the first portion of the first polysilicon layer, depositing a second polysilicon layer over the second IMD layer and further over the first portion of the first polysilicon layer, wherein the second polysilicon layer directly connects to the first portion of the first polysilicon layer;
   etching a portion of the second polysilicon layer to form a patterned second polysilicon layer and to expose a portion of the second IMD layer, wherein the etching the portion of the second polysilicon layer forms the bumpstop and a plurality of electrodes;
   depositing a third IMD layer over the patterned second polysilicon layer and the exposed portion of the second IMD layer;
   forming a via through the third IMD layer to expose a first portion of the patterned second polysilicon layer;
   filling the via;
   forming a bond layer over the via; and
   etching a portion of the third IMD layer to expose a second portion of the patterned second polysilicon layer, wherein the second portion of the patterned second polysilicon layer is different from the first portion of the patterned second polysilicon layer.

2. The method of claim 1, further comprising bonding a micro-electro-mechanical systems (MEMS) layer comprising a cap layer and a MEMS device layer structures to the substrate.

3. The method of claim 2, wherein the bonding comprises eutectically bonding the bond layer over the via with Germanium on the MEMS device layer.

4. The method of claim 1, wherein the etching a portion of the third IMD layer comprises of exposing the bumpstop and the plurality of electrodes.

5. The method of claim 1 further comprising forming a getter layer over an electrode.

6. The method of claim 5, wherein the getter layer comprises Ti.

7. The method of claim 5, wherein the etching a portion of the third IMD layer comprises of exposing the getter layer.

8. The method of claim 1 further comprising depositing a passivation layer comprising SiN over the third IMD layer.

9. The method of claim 1 further comprising depositing a high-density plasma (HDP) oxide in the passivation and within the third IMD layer.

10. A method comprising:
    forming a bumpstop from a first intermetal dielectric (IMD) layer and forming a via within the first IMD, wherein the first IMD is disposed over a first polysilicon layer, and wherein the first polysilicon layer is disposed over another IMD layer that is disposed over a substrate;
    depositing a second polysilicon layer over the bumpstop and further over the via to connect to the first polysilicon layer;
    forming a standoff over a first portion of the second polysilicon layer, and wherein a second portion of the second polysilicon layer is exposed; and
    depositing a bond layer over the standoff.

11. The method of claim 10, further comprising bonding a micro-electro-mechanical systems (MEMS) layer comprising a MEMS device layer and a cap layer to the substrate via the bond layer over the standoff, wherein the second portion of the second polysilicon layer is within a cavity formed after bonding.

12. The method of claim 10, wherein forming the standoff comprises:
    depositing a second IMD layer over the second polysilicon layer;

forming a via through the second IMD layer to expose a portion of the second polysilicon layer underneath the second IMD layer;

filling the via;

depositing another bond layer covering the via and the second IMD layer;

patterning the another bond layer, wherein a region associated with the standoff is covered by the another bond layer; and etching the second IMD layer that is uncovered by the another bond layer.

13. The method of claim 10 further comprising forming a passivation layer over the second IMD layer, and wherein the bond layer covers the passivation layer, and wherein the passivation layer that is uncovered by the bond layer after patterning is etched.

14. The method of claim 10 further comprising depositing an outgassing substance within the second IMD layer.

15. The method of claim 10 further comprising forming a getter layer over the second polysilicon layer.

16. The method of claim 15, wherein the getter layer comprises Ti.

17. A method comprising:

depositing a first intermetal dielectric (IMD) layer over a substrate;

depositing a first polysilicon layer over the first IMD layer;

depositing a second IMD layer over the first polysilicon layer;

etching the second IMD layer to form a standoff and a bumpstop;

etching at least a portion of the second IMD layer other than the standoff and the bumpstop to form a via to expose a portion of the first polysilicon layer;

depositing a second polysilicon layer over the standoff, the bumpstop, the exposed portion of the first polysilicon layer that connects the two polysilicon layers together, and the second IMD layer;

depositing a bond layer over the second polysilicon layer;

patterning the bond layer to cover the standoff; and patterning a portion of the second polysilicon layer to expose a portion of the second IMD layer and to form a plurality of electrodes.

18. The method of claim 17 further comprising bonding a micro-electro-mechanical systems (MEMS) layer comprising a MEMS device layer and a cap layer to the standoff.

19. The method of claim 17 further comprising forming a getter layer over the second polysilicon layer prior to depositing the bond layer.

20. The method of claim 19 further comprising patterning the getter layer to expose a portion of the second polysilicon layer.

21. The method of claim 19, wherein the getter layer comprises Ti.

22. The method of claim 17 further comprising depositing a passivation layer over the second IMD layer prior to forming the standoff and the bumpstop.

23. The method of claim 17 further comprising forming an outgassing substance within the second IMD layer prior to etching the least the portion of the second IMD layer.

* * * * *